US012780025B2

(12) United States Patent
Brannan

(10) Patent No.: US 12,780,025 B2
(45) Date of Patent: Nov. 3, 2026

(54) ELECTRIC VEHICLE CHARGING MANAGEMENT SYSTEM AND METHOD

(71) Applicant: State Farm Mutual Automobile Insurance Company, Bloomington, IL (US)

(72) Inventor: Joseph R. Brannan, Bloomington, IL (US)

(73) Assignee: State Farm Mutual Automobile Insurance Company, Bloomington, IL (US)

( * ) Notice: Subject to any disclaimer, the term of this patent is extended or adjusted under 35 U.S.C. 154(b) by 25 days.

(21) Appl. No.: 18/955,498

(22) Filed: Nov. 21, 2024

(65) Prior Publication Data

US 2025/0083547 A1 Mar. 13, 2025

Related U.S. Application Data

(63) Continuation of application No. 18/363,124, filed on Aug. 1, 2023, now Pat. No. 12,187,147, which is a
(Continued)

(51) Int. Cl.
*G05D 1/00* (2024.01)
*B60L 53/30* (2019.01)
(Continued)

(52) U.S. Cl.
CPC ............. *B60L 53/35* (2019.02); *B60L 53/305* (2019.02); *B60L 53/36* (2019.02); *B60L 53/53* (2019.02);
(Continued)

(58) Field of Classification Search
CPC . B60K 6/28; B60L 2240/62; B60L 2240/622; B60L 2240/72; B60L 2260/32;
(Continued)

(56) References Cited

U.S. PATENT DOCUMENTS

| | | | |
|---|---|---|---|
| 6,044,261 | A | 3/2000 | Kazmi |
| 6,496,689 | B1 | 12/2002 | Keller et al. |

(Continued)

FOREIGN PATENT DOCUMENTS

| | | | |
|---|---|---|---|
| DE | 102015219425 | A1 | 5/2016 |
| EP | 3239686 | A1 | 11/2017 |

(Continued)

OTHER PUBLICATIONS

Masuch, Nils et al., "A Context-Aware Mobile Accessible Electric Vehicle Management System," Proceedings of the Federated Conference on Computer Science and Information Systems, 2011, ISBN 978-83-60810-39-2; pp. 305-312.

(Continued)

*Primary Examiner* — Charles J Han
(74) *Attorney, Agent, or Firm* — Armstrong Teasdale LLP

(57) ABSTRACT

Computer-implemented methods and computer systems are disclosed herein as implemented by one or more local or remote processors, transceivers, servers, and/or sensors. The methods and systems include the one or more processors (i) determining an electric vehicle has a state of charge (SOC) below a predetermined threshold; (ii) if the SOC is determined to be below the predetermined threshold, determining homes capable of charging electric vehicles within a vicinity of, or a predetermined distance of, the low SOC vehicle's GPS location; (iii) from among the homes within the predetermined distance of the low SOC vehicle, ranking the homes based upon various factors; and/or (iv) scheduling a rendezvous or appointment for the low SOC vehicle with the highest ranked home for recharging the low SOC vehicle, the highest ranked home being equipped to recharge the low SOC vehicle and is available to charge the low SOC vehicle.

20 Claims, 9 Drawing Sheets

Related U.S. Application Data continuation of application No. 16/729,869, filed on Dec. 30, 2019, now Pat. No. 11,850,967.

(60) Provisional application No. 62/939,906, filed on Nov. 25, 2019, provisional application No. 62/938,676, filed on Nov. 21, 2019, provisional application No. 62/930,807, filed on Nov. 5, 2019, provisional application No. 62/923,713, filed on Oct. 21, 2019.

(51) Int. Cl.

| | |
|---|---|
| ***B60L 53/35*** | (2019.01) |
| ***B60L 53/36*** | (2019.01) |
| ***B60L 53/53*** | (2019.01) |
| ***B60L 53/62*** | (2019.01) |
| ***B60L 53/63*** | (2019.01) |
| ***B60L 53/66*** | (2019.01) |
| ***B60L 53/68*** | (2019.01) |
| ***B60L 58/12*** | (2019.01) |
| ***B60L 58/13*** | (2019.01) |
| ***B60L 58/14*** | (2019.01) |
| ***B60L 58/18*** | (2019.01) |
| ***G01C 21/34*** | (2006.01) |
| ***G01R 31/367*** | (2019.01) |
| ***G01R 31/382*** | (2019.01) |
| ***G05D 1/227*** | (2024.01) |
| ***G05D 1/247*** | (2024.01) |
| ***G05D 1/248*** | (2024.01) |
| ***G05D 1/661*** | (2024.01) |
| ***G05D 1/698*** | (2024.01) |
| ***G06Q 10/047*** | (2023.01) |
| ***G06Q 10/0631*** | (2023.01) |
| ***G06Q 10/1093*** | (2023.01) |
| ***G06Q 10/20*** | (2023.01) |
| ***G06Q 30/0204*** | (2023.01) |
| ***G06Q 30/08*** | (2012.01) |
| ***G08G 1/0968*** | (2006.01) |
| ***G08G 1/137*** | (2006.01) |
| *B60K 6/28* | (2007.10) |
| *B60L 53/57* | (2019.01) |
| *G01S 19/42* | (2010.01) |
| *G05D 111/30* | (2024.01) |
| *G06Q 50/06* | (2012.01) |

(52) U.S. Cl.

CPC ............... *B60L 53/62* (2019.02); *B60L 53/63* (2019.02); *B60L 53/66* (2019.02); *B60L 53/665* (2019.02); *B60L 53/68* (2019.02); *B60L 58/12* (2019.02); *B60L 58/13* (2019.02); *B60L 58/14* (2019.02); *B60L 58/18* (2019.02); *G01C 21/3469* (2013.01); *G01R 31/367* (2019.01); *G01R 31/382* (2019.01); *G05D 1/0088* (2013.01); *G05D 1/0225* (2013.01); *G05D 1/0278* (2013.01); *G05D 1/028* (2013.01); *G05D 1/227* (2024.01); *G05D 1/247* (2024.01); *G05D 1/248* (2024.01); *G05D 1/661* (2024.01); *G05D 1/6987* (2024.01); *G06Q 10/047* (2013.01); *G06Q 10/06316* (2013.01); *G06Q 10/1093* (2013.01); *G06Q 10/20* (2013.01); *G06Q 30/0205* (2013.01); *G06Q 30/08* (2013.01); *G08G 1/096838* (2013.01); *G08G 1/096844* (2013.01); *G08G 1/096883* (2013.01); *G08G 1/137* (2013.01); *B60K 6/28* (2013.01); *B60L 53/57* (2019.02); *B60L 2240/62* (2013.01); *B60L 2240/622* (2013.01); *B60L 2240/72* (2013.01); *B60L 2260/32* (2013.01); *B60Y 2200/91* (2013.01); *B60Y 2200/92* (2013.01); *B60Y 2300/91* (2013.01); *G01S 19/42* (2013.01); *G05D 2111/30* (2024.01); *G06Q 50/06* (2013.01); *Y02T 10/70* (2013.01); *Y02T 10/7072* (2013.01); *Y02T 90/12* (2013.01); *Y02T 90/16* (2013.01)

(58) Field of Classification Search

CPC ........ B60L 53/305; B60L 53/35; B60L 53/36; B60L 53/53; B60L 53/57; B60L 53/62; B60L 53/63; B60L 53/66; B60L 53/665; B60L 53/68; B60L 58/12; B60L 58/13; B60L 58/14; B60L 58/18; B60Y 2200/91; B60Y 2200/92; B60Y 2300/91; G01C 21/3469; G01R 31/367; G01R 31/382; G01S 19/42; G05D 1/0088; G05D 1/0225; G05D 1/0278; G05D 1/028; G05D 1/0297; G05D 1/227; G05D 1/247; G05D 1/248; G05D 1/661; G05D 1/6987; G05D 2111/30; G06Q 10/047; G06Q 10/06316; G06Q 10/1093; G06Q 10/20; G06Q 30/0205; G06Q 30/08; G06Q 50/06; G08G 1/096838; G08G 1/096844; G08G 1/096883; G08G 1/137; Y02T 10/70; Y02T 10/7072; Y02T 90/12; Y02T 90/16

See application file for complete search history.

(56) References Cited

U.S. PATENT DOCUMENTS

| | | | |
|---|---|---|---|
| 8,860,362 | B2 | 10/2014 | Kamen et al. |
| 9,264,849 | B1 | 2/2016 | Kahn et al. |
| 9,587,952 | B1 | 3/2017 | Slusar |
| 9,709,988 | B2 | 7/2017 | Miller et al. |
| 9,778,653 | B1 | 10/2017 | McClintock et al. |
| 9,830,748 | B2 | 11/2017 | Rosenbaum |
| 9,990,782 | B2 | 6/2018 | Rosenbaum |
| 10,269,190 | B2 | 4/2019 | Rosenbaum |
| 10,333,338 | B2 | 6/2019 | Zenner et al. |
| 10,399,461 | B1 | 9/2019 | Sosinov et al. |
| 10,409,285 | B2 | 9/2019 | Bostick et al. |
| 10,467,824 | B2 | 11/2019 | Rosenbaum |
| 11,133,688 | B2 | 9/2021 | Schaffer et al. |
| 11,216,824 | B1 | 1/2022 | Faga et al. |
| 11,227,452 | B2 | 1/2022 | Rosenbaum |
| 11,407,410 | B2 | 8/2022 | Rosenbaum |
| 11,447,024 | B1 | 9/2022 | Brannan |
| 11,524,707 | B2 | 12/2022 | Rosenbaum |
| 11,541,773 | B2 | 1/2023 | Choi et al. |
| 11,594,083 | B1 | 2/2023 | Rosenbaum |
| 11,981,223 | B2 | 5/2024 | Brannan |
| 2006/0293849 | A1 | 12/2006 | Baldwin |
| 2007/0149711 | A1 | 6/2007 | Chaudhary et al. |
| 2008/0281663 | A1 | 11/2008 | Hakim et al. |
| 2009/0043520 | A1 | 2/2009 | Pollack et al. |
| 2009/0082957 | A1 | 3/2009 | Agassi et al. |
| 2009/0222143 | A1 | 9/2009 | Kempton |
| 2010/0060720 | A1 | 3/2010 | Hirasawa |
| 2011/0191186 | A1 | 8/2011 | Levy et al. |
| 2011/0202217 | A1 | 8/2011 | Kempton |
| 2011/0202476 | A1 | 8/2011 | Nagy et al. |
| 2011/0225105 | A1 | 9/2011 | Scholer et al. |
| 2011/0238519 | A1 | 9/2011 | Basak et al. |
| 2011/0246252 | A1 | 10/2011 | Uesugi |
| 2012/0005031 | A1 | 1/2012 | Jammer |
| 2012/0089408 | A1 | 4/2012 | Stancil et al. |
| 2012/0095830 | A1 | 4/2012 | Contreras Delpiano et al. |
| 2012/0109409 | A1 | 5/2012 | Hara |
| 2012/0271758 | A1 | 10/2012 | Jammer |
| 2012/0296678 | A1 | 11/2012 | Boot et al. |
| 2012/0303259 | A1 | 11/2012 | Prosser |

(56) References Cited

U.S. PATENT DOCUMENTS

| | | | |
|---|---|---|---|
| 2012/0303397 | A1 | 11/2012 | Prosser |
| 2012/0306446 | A1 | 12/2012 | Suganuma et al. |
| 2013/0020993 | A1 | 1/2013 | Taddeo et al. |
| 2013/0043838 | A1 | 2/2013 | Tsuchiya |
| 2014/0129139 | A1 | 5/2014 | Ellison et al. |
| 2014/0278104 | A1 | 9/2014 | Proietty et al. |
| 2015/0042278 | A1 | 2/2015 | Leary |
| 2015/0149221 | A1 | 5/2015 | Tremblay |
| 2015/0165915 | A1 | 6/2015 | Cun |
| 2015/0239365 | A1 | 8/2015 | Hyde et al. |
| 2015/0291047 | A1 | 10/2015 | Saito et al. |
| 2015/0321570 | A1 | 11/2015 | Cun |
| 2016/0129793 | A1 | 5/2016 | Cronie |
| 2016/0137077 | A1 | 5/2016 | Kim et al. |
| 2016/0225095 | A1 | 8/2016 | Biemer et al. |
| 2016/0257212 | A1 | 9/2016 | Thompson et al. |
| 2016/0321740 | A1 | 11/2016 | Hill |
| 2016/0344818 | A1 | 11/2016 | Bhayani |
| 2017/0050529 | A1 | 2/2017 | Lambert et al. |
| 2017/0168493 | A1 | 6/2017 | Miller et al. |
| 2017/0176195 | A1 | 6/2017 | Rajagopalan et al. |
| 2017/0262790 | A1 | 9/2017 | Khasis |
| 2017/0282736 | A1 | 10/2017 | Goei |
| 2017/0299402 | A1 | 10/2017 | Hansen et al. |
| 2017/0355271 | A1 | 12/2017 | Cronie |
| 2017/0363432 | A1 | 12/2017 | Hall et al. |
| 2017/0374202 | A1 | 12/2017 | Zait et al. |
| 2018/0016131 | A1 | 1/2018 | Varini |
| 2018/0045533 | A1 | 2/2018 | Jackson et al. |
| 2018/0081360 | A1 | 3/2018 | Bostick et al. |
| 2018/0257498 | A1 | 9/2018 | Delp |
| 2018/0281606 | A1 | 10/2018 | Scherer |
| 2018/0281612 | A1 | 10/2018 | Perry et al. |
| 2018/0339682 | A1 | 11/2018 | Hall et al. |
| 2018/0373268 | A1 | 12/2018 | Antunes Marques Esteves |
| 2019/0009756 | A1 | 1/2019 | Jacobs |
| 2019/0016312 | A1 | 1/2019 | Carlson et al. |
| 2019/0047427 | A1 | 2/2019 | Pogorelik |
| 2019/0089024 | A1 | 3/2019 | Enzinger et al. |
| 2019/0152329 | A1 | 5/2019 | Onodera et al. |
| 2019/0165591 | A1 | 5/2019 | Kisacikoglu et al. |
| 2019/0178678 | A1 | 6/2019 | Rahbari Asr et al. |
| 2019/0202304 | A1 | 7/2019 | Moghe et al. |
| 2019/0255963 | A1 | 8/2019 | Goei |
| 2019/0275907 | A1 | 9/2019 | Lee et al. |
| 2019/0279266 | A1 | 9/2019 | Hayrabedian |
| 2019/0308513 | A1 | 10/2019 | Akhavan-Tafti |
| 2019/0344679 | A1 | 11/2019 | Miller et al. |
| 2019/0351783 | A1 | 11/2019 | Goei |
| 2019/0361950 | A1 | 11/2019 | Ganesan et al. |
| 2019/0383637 | A1 | 12/2019 | Teske |
| 2020/0023747 | A1* | 1/2020 | Logvinov ............... B60L 50/60 |
| 2020/0122595 | A1 | 4/2020 | Nonnenmacher et al. |
| 2020/0184576 | A1 | 6/2020 | Rayes et al. |
| 2020/0219332 | A1 | 7/2020 | Shekar et al. |
| 2020/0262305 | A1 | 8/2020 | Chakraborty et al. |
| 2020/0262307 | A1 | 8/2020 | Rosene et al. |
| 2020/0269720 | A1 | 8/2020 | Enslin et al. |
| 2020/0317067 | A1 | 10/2020 | Miller |
| 2020/0317077 | A1 | 10/2020 | Schaffer et al. |
| 2020/0324667 | A1 | 10/2020 | Yaldo et al. |
| 2020/0333151 | A1* | 10/2020 | Akhtar .................... B60L 53/64 |
| 2020/0341472 | A1 | 10/2020 | Zenner et al. |
| 2020/0353836 | A1 | 11/2020 | Imberger |
| 2020/0376972 | A1 | 12/2020 | Martin et al. |
| 2020/0386561 | A1 | 12/2020 | Namiki |
| 2021/0053458 | A1 | 2/2021 | Fujiwara et al. |
| 2021/0096564 | A1 | 4/2021 | Panigrahi et al. |
| 2021/0118070 | A1 | 4/2021 | Taber, Jr. et al. |
| 2021/0203177 | A1 | 7/2021 | Peng |
| 2021/0237797 | A1 | 8/2021 | Faivre |
| 2021/0241626 | A1 | 8/2021 | Nishimura et al. |
| 2021/0380012 | A1 | 12/2021 | Tsuda et al. |
| 2022/0092893 | A1 | 3/2022 | Rosenbaum |
| 2022/0118878 | A1 | 4/2022 | Kwapisz |
| 2022/0187091 | A1 | 6/2022 | Suzuki et al. |
| 2022/0340148 | A1 | 10/2022 | Rosenbaum |
| 2023/0060300 | A1 | 3/2023 | Rosenbaum |

FOREIGN PATENT DOCUMENTS

| | | | |
|---|---|---|---|
| EP | 3578433 | B1 | 8/2020 |
| EP | 3730375 | B1 | 10/2021 |
| EP | 3960576 | A1 | 3/2022 |
| EP | 4190659 | A1 | 6/2023 |
| EP | 4190660 | A1 | 6/2023 |
| WO | 2007149711 | A2 | 12/2007 |
| WO | 2010060720 | A2 | 6/2010 |
| WO | 2015063967 | A1 | 5/2015 |
| WO | 2017154219 | A1 | 9/2017 |
| WO | 2018072613 | A1 | 4/2018 |
| WO | 2018130336 | A1 | 7/2018 |
| WO | 2018156732 | A1 | 8/2018 |
| WO | 2019094900 | A1 | 5/2019 |
| WO | 2019174949 | A1 | 9/2019 |

OTHER PUBLICATIONS

Truesdell, EVmatch: A Creative Solution To Increase Electric Vehicle Charging Access For Everyone, Mar. 3, 2019, CleanTechnica (Year: 2019).

* cited by examiner

800

900

1000

ELECTRIC VEHICLE CHARGING MANAGEMENT SYSTEM AND METHOD

CROSS-REFERENCE TO RELATED APPLICATIONS

The present application is a continuation of and claims priority to U.S. patent application Ser. No. 18/363,124, filed Aug. 1, 2023, which is a continuation of U.S. application Ser. No. 16/729,869, now U.S. Pat. No. 11,850,967, filed Dec. 30, 2019, which claims the benefit of U.S. Provisional Application No. 62/923,713, filed Oct. 21, 2019; U.S. Provisional Application No. 62/930,807, filed Nov. 5, 2019; U.S. Provisional Application No. 62/938,676, filed Nov. 21, 2019; and U.S. Provisional Application No. 62/939,906, filed Nov. 25, 2019, the subject matter of each of which are expressly incorporated herein by reference in their entirety.

TECHNICAL FIELD

The present disclosure generally relates to electric vehicles, and more particularly systems and methods for managing battery charging for electric vehicles.

BACKGROUND

Electric vehicles are becoming more popular as more focus is placed on sustainable, environmentally friendly energy. However, electric vehicles also create a unique problem for the vehicle industry, because unlike fuel-powered cars, these vehicles cannot become fully charged as quickly as filling up a fuel tank at a gas station, and when they run out of energy, the solution is not as simple as bringing a can of gasoline or diesel to fuel them up. The absence of an easily available power source may lead to a condition referred to as "range anxiety" when a driver is worried that the vehicle cannot get to its destination or the next charging station before running out of battery power.

Accordingly, there is a need in the industry for a reliable system for providing power to electric vehicles when necessary, and/or an alternative solution for when electric vehicles run out of, or get low on, battery power.

SUMMARY

In one embodiment, a computer-implemented method is provided for recharging the battery of an electric vehicle with a low state of charge (SOC). The method is implemented via one or more local or remote processors, transceivers, servers, and/or sensors. The method may include: (i) determining an electric vehicle has a state of charge (SOC) below a predetermined threshold; (ii) if the SOC is determined to be below the predetermined threshold, determining homes capable of charging electric vehicles within a vicinity of, or a predetermined distance of, the low SOC vehicle's GPS location; (iii) from among the homes within the predetermined distance of the low SOC vehicle, ranking the homes based upon various factors; and/or (iv) scheduling a rendezvous or appointment for the low SOC vehicle with the highest ranked home for recharging the low SOC vehicle, the highest ranked home being equipped to recharge the low SOC vehicle and is available to charge the low SOC vehicle. The method may include additional, less, or alternate functionality, including that discussed elsewhere herein.

For instance, in one embodiment, the method may also include collecting and analyzing, by a mobile device associated with the low SOC vehicle, vehicle telematics data.

The vehicle telematics data may include one or more of: acceleration, braking, cornering, speed, direction, route, GPS location, and SOC of the low SOC vehicle. The predetermined threshold may be defined as a percentage of the SOC remaining in the electric vehicle. The predetermined threshold may also be defined as a determined distance that the electric vehicle is capable of traveling based upon the SOC remaining in the electric vehicle. In one embodiment, each of the homes within the predetermined distance of the low SOC vehicle may be ranked based upon (a) distance to the low SOC vehicle, (b) charging equipment; (c) neighborhood of the home; (d) ease of access to the home, such as near a highway; and/or (e) whether the home is located along the route of the low SOC vehicle. Additionally or alternatively, charging equipment data, type of neighborhood data, and ease of access to the home and/or to the charging equipment data may be included in home telematics data broadcasted by each home via wireless communication or data transmission.

In one embodiment, the method may further include determining or evaluating, via the one or more processors, time constraints and/or availability of the ranked homes to charge. The time constraints and/or the availability may be determined by collecting home owner electronic calendar data broadcasted by each of the homes. The home owner electronic calendar data may include home owner charging preference data and/or home occupancy data. The method may also include re-ranking or eliminating one or more of the ranked homes based upon the determined or evaluated time constraints and/or availability. Additionally or alternatively, the method may also include determining or evaluating, via the one or more processors, energy costs for each remaining ranked home.

In one embodiment, the method may include determining or evaluating, via the one or more processors, energy and charging supply and demand for the area through which the low SOC vehicle is traveling. The method may further include initiating, by the one or more processors, a bidding process for a driver of the low SOC vehicle to bid on the homes in the vicinity. The low SOC vehicle may be autonomous, and the one or more processors determine a route for the autonomous low SOC vehicle, and automatically route the low SOC vehicle to the home.

In one embodiment, a computer system for recharging the battery of an electric vehicle with a low state of charge (SOC) is provided. The computer system may include one or more local or remote processors, transceivers, servers, and/or sensors. The computer system or any component thereof may (i) determine an electric vehicle has a state of charge (SOC) below a predetermined threshold; (ii) if the SOC is determined to be below the predetermined threshold, determine homes capable of charging electric vehicles within a vicinity of, or a predetermined distance of, the low SOC vehicle's GPS location; (iii) from among the homes within the predetermined distance of the low SOC vehicle, rank the homes based upon various factors; and/or (iv) schedule a rendezvous or appointment for the low SOC vehicle with the highest ranked home for recharging the low SOC vehicle, the highest ranked home being equipped to recharge the low SOC vehicle and is available to charge the low SOC vehicle. The computer system may include additional, less, or alternate functionality, including that discussed elsewhere herein.

In one embodiment, the computer system may be further configured to collect and analyze, by a mobile device associated with the low SOC vehicle, vehicle telematics data. The vehicle telematics data may include one or more of: acceleration, braking, cornering, speed, direction, route, GPS location, and SOC of the low SOC vehicle. The predetermined threshold may be defined as a percentage of the SOC remaining in the electric vehicle. Additionally or alternatively, the predetermined threshold may also be defined as a determined distance that the electric vehicle is capable of traveling based upon the SOC remaining in the electric vehicle.

While multiple embodiments are disclosed, still other embodiments of the presently disclosed subject matter will become apparent to those skilled in the art from the following detailed description, which shows and describes illustrative embodiments of the disclosed subject matter. Accordingly, the drawings and detailed description are to be regarded as illustrative in nature and not restrictive.

BRIEF DESCRIPTION OF THE DRAWINGS

The above mentioned and other features and objects of this disclosure, and the manner of attaining them, will become more apparent and the disclosure itself will be better understood by reference to the following description of one embodiment of the disclosure taken in conjunction with the accompanying drawings, wherein.

Figure 1:
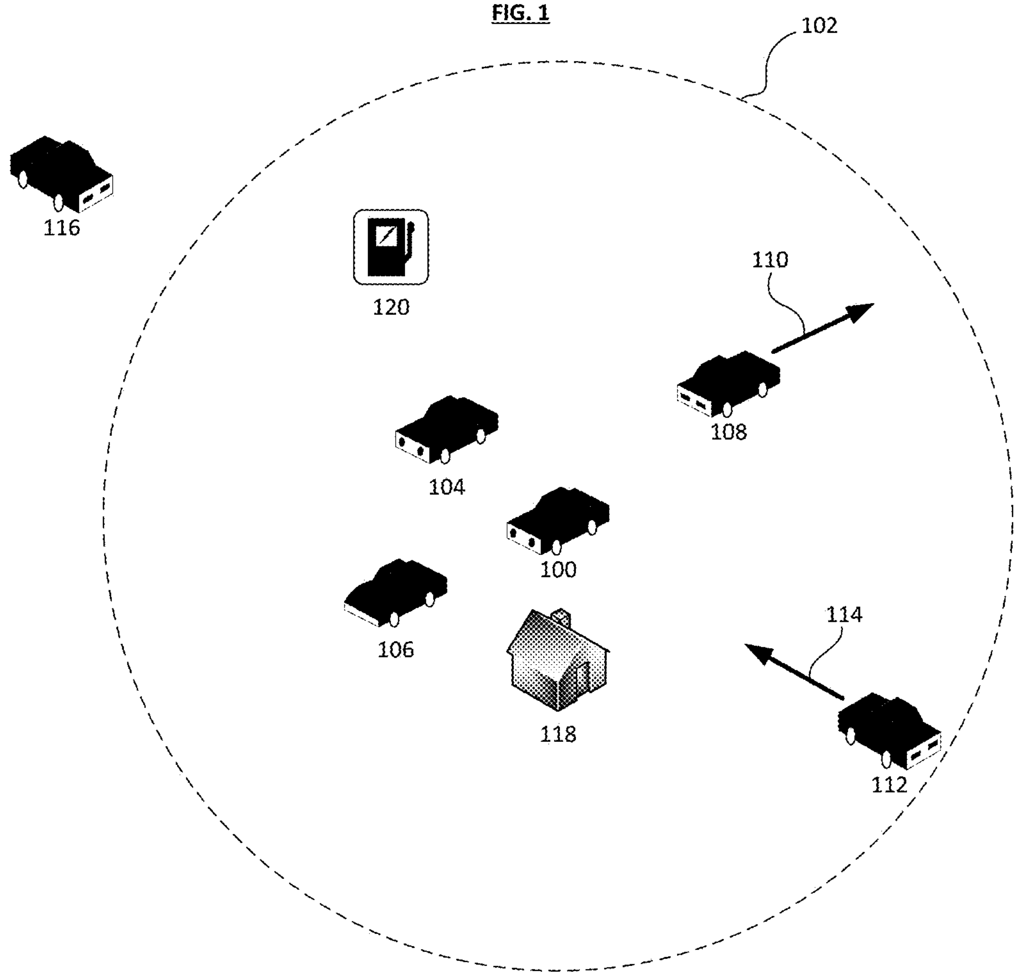
FIG. 1 depicts an exemplary layout of a plurality of electric vehicles as detected by an electric vehicle charging management system according to one embodiment as disclosed herein.

Corresponding reference characters indicate corresponding parts throughout the several views. Although the drawings represent embodiments of the present disclosure, the drawings are not necessarily to scale, and certain features may be exaggerated in order to better illustrate and explain the present disclosure. The exemplification set out herein illustrates one embodiment of the disclosure, in one form, and such exemplifications are not to be construed as limiting the scope of the disclosure in any manner.

DETAILED DESCRIPTION

The embodiment disclosed below is not intended to be exhaustive or limit the disclosure to the precise form disclosed in the following detailed description. Rather, the embodiment is chosen and described so that others skilled in the art may utilize its teachings. One of ordinary skill in the art will realize that the embodiments provided can be implemented in hardware, software, firmware, and/or a combination thereof. Programming code according to the embodiments can be implemented in any viable programming language or a combination of programming languages.

Exemplary Electric Vehicle

Figure 2:
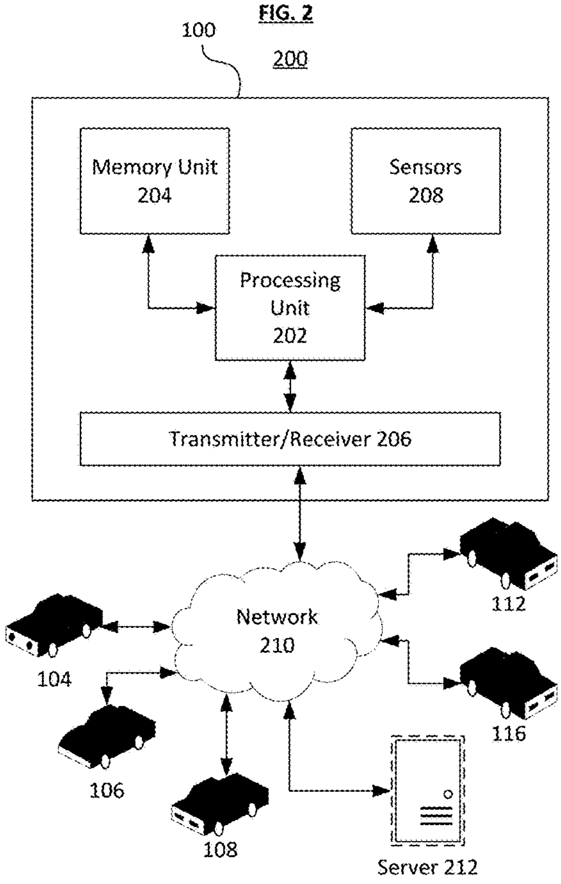
FIG. 2 depicts an exemplary schematic diagram of an electric vehicle with various components therein and an electric vehicle charging system infrastructure according to one embodiment as disclosed herein.

FIGS. 1 and 2 depict an exemplary electric vehicle 100 in a vehicle management system in accordance with some embodiments disclosed herein. In the shown example in FIG. 1, the electric vehicle 100 is in a vicinity of a plurality of other electric vehicles 104, 106, 108, 112 that are within a threshold range 102 from the vehicle 100. An additional electric vehicle 116 is shown to be outside the range 102. Also shown are the directions in which some of the vehicles are heading. For example, the vehicle 108 is heading in a direction 110 away from the vehicle 100, and the vehicle 112 is heading in a direction 114 toward the vehicle 100. Additionally, a charging station 120 that is closest to the vehicle 100 is also shown. It is to be understood that these directions and locations of the vehicles are illustrated as examples, and that there may be fewer or greater number of electric vehicles which may be located within the range 102.

FIG. 2 shows the components within the electric vehicle 100 according to some embodiments. The electric vehicle 100 may include a processing unit 202, a memory unit 204, a transmitter/receiver 206, and sensors 208. The processing unit 202 as disclosed herein may be any electronic device that is capable of processing data, for example a central processing unit (CPU), a graphics processing unit (GPU), a system on a chip, or any other suitable type of processor. The memory unit 204 may be a random-access memory (RAM), read-only memory (ROM), a flash memory, or any other suitable type of memory that enables storage of data such as instruction codes that the processing unit 202 needs to access in order to implement any method as disclosed herein.

For example, the memory unit 204 may include the instruction codes used by the processing unit 202 to run an algorithm to determine how much power is stored in a battery or batteries implemented in the vehicle 100 using the sensors 208 as well as a predicted range of the vehicle 100 based upon the measured power. The sensors 208 may be a voltmeter coupled to the battery to measure the state of charge (SOC), for example. The measurement taken by the sensors 208 are then used by the processing unit 202 to calculate how far the vehicle 100 may be able to travel before the vehicle 100 completely runs out of battery, which is also called its predicted range of operation. If the SOC is low, the vehicle 100 would naturally have smaller range of operation and would need to be charged before the vehicle 100 reaches an edge of the range of operation.

The transmitter/receiver 206 may be any suitable data transmitting/receiving device that enables the data processed by the processing unit 202 to be transmitted to the network 208, and the data from the network 208 to be received by the electric vehicle 100. The transmitter/receiver 206 may be designed to operate according to predetermined specifications, such as the dedicated short-range communication (DSRC) channel, wireless telephony, Wi-Fi, or other existing or later-developed communication protocols.

Exemplary Vehicle Charging Management System

Figure 3:
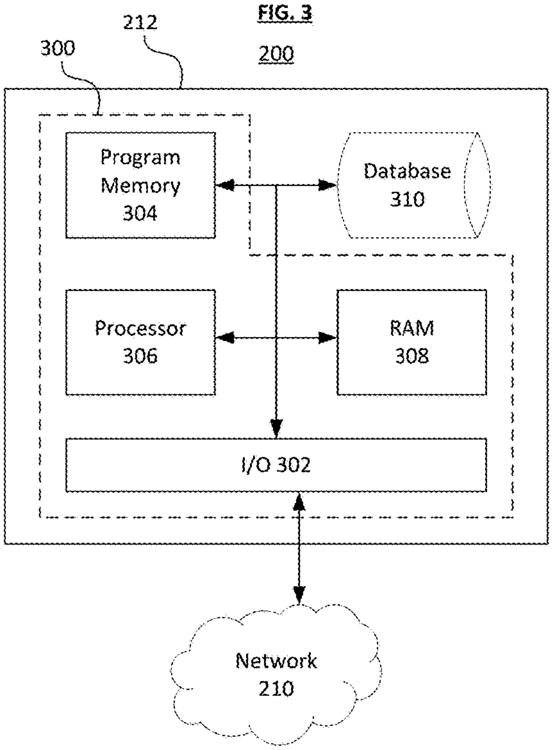
FIG. 3 depicts an exemplary schematic diagram of a server as depicted in the system infrastructure of FIG. 2 according to one embodiment as disclosed herein.

FIGS. 2 and 3 show an exemplary system infrastructure 200 in which the electric vehicle 100, as well as the other vehicles 104, 106, 108, 112, 116, are connected via a network 210 to a remote server 212. The network 210 is any suitable type of computer network that functionally couples some or all of the vehicles 100, 104, 106, 108, 112, 116 with the server 212. The network 210 may include a proprietary network, a secure public internet, a virtual private network and/or one or more other types of networks, such as dedicated access lines, plain ordinary telephone lines, satellite links, cellular data networks, or combinations thereof. In embodiments where the network 210 comprises the Internet, data communications may take place over the network 210 via an Internet communication protocol.

The server 212 may further include a database 310, which may be adapted to store data related to the information that is being transmitted from any number of vehicles. As used herein, the term "database" may refer to a single database or other structured data storage, or to a collection of two or more different databases or structured data storage components. The data stored in the database 220 might include, for example, the most recently recorded locations and directions as well as the current battery SOC and various other information of a plurality of electric vehicles which are in constant connection with the server 212.

The server 212 may include a controller 300 that is operatively connected to the database 310, as shown in FIG. 3. For the sake of simplicity, other components such as the electric vehicles as previously described are not shown in FIG. 3. It should also be noted that, while not shown in FIG. 2 or 3, one or more additional databases may be linked to the controller 300 in a known manner. For example, separate databases may be used for various types of information, such as the road condition and terrain information, the proprietary information of the vehicles, the residence information of the owners of the vehicles, the locations of the charging stations 120 in the area, and so on. Additional databases (not shown) may be communicatively connected to the server 212 via the network 210, such as databases maintained by third parties (e.g., weather, construction, or road network databases). The controller 300 may include an input/output (I/O) circuit 302, a program memory 304, a processor 306 (which may be called a microcontroller or a microprocessor), and a random-access memory (RAM) 308, all of which may be interconnected via an address/data bus. It should be appreciated that although only one microprocessor 306 is shown, the controller 300 may include multiple microprocessors 306. Similarly, the memory of the controller 300 may include multiple RAMs 308 and multiple program memories 304. Although the I/O circuit 302 is shown as a single block, it should be appreciated that the I/O circuit 302 may include a number of different types of I/O circuits. The RAM 308 and program memories 304 may be implemented as semiconductor memories, magnetically readable memories, or optically readable memories, for example. The controller 300 may also be operatively connected to the network 210 via a link.

The server 212 may further include a number of software applications stored in a program memory 304. The various software applications on the server 212 may include a vehicle operation information monitoring application or receiving information regarding the electric vehicles and their current locations, predicted routes, vehicle conditions, battery SOC, and owner/user information such as whether the owner/user of the vehicle opts in to assist other vehicles charge their batteries as well as information regarding the home addresses of the owners who opt in to allow other users charge batteries at their homes. Other software applications may include a status evaluation application for determining which of the electric vehicles are located nearby within a predetermined radius, whether the vehicles have enough SOC such that the vehicles can travel at least a certain predetermined distance after charging another vehicle, and which of the vehicles are capable of reaching the vehicle that requires charging with minimal rerouting. The various software applications may be executed on the same computer processor or on different computer processors.

In some embodiments, the server 212 may be a remote server associated with the charging stations. The server 212 may be configured to receive, collect, and/or analyze data regarding the electric vehicles registered to be connected via the network 210 in accordance with any of the methods described herein. The server 212 may be configured for one-way or two-way wired or wireless communication via the network 210 with a number of telematics and/or other data sources, including a third-party database, for example. The server 212 may be in wired or wireless communications with other sources of data, including those discussed elsewhere herein.

Exemplary Computer-Implemented Method

Figure 4:
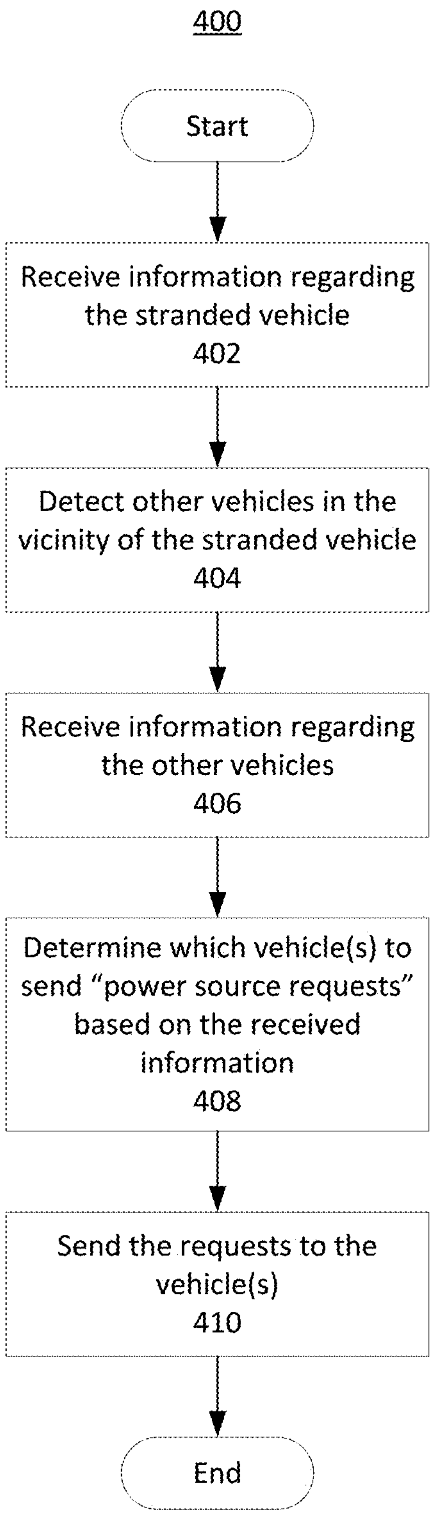
FIG. 4 depicts an exemplary flow diagram of a computer-implemented method performed by a controller of the server according to one embodiment as disclosed herein.

FIG. 4 shows an exemplary computer-implemented method 400 used by the controller 300 of the server 212 according to some embodiments to send "power source requests" for one or more electric vehicles to assist the stranded electric vehicle 100 by providing power to charge the battery. In the first block 402, the controller 300 receives via the network 210 an alert from an electric vehicle, which in this case is the electric vehicle 100 in FIG. 1, indicating that the electric vehicle 100 is stranded on the road with no power left in the battery. As such, controller 300 receives, in the block 402, information regarding the stranded vehicle 100 including but not limited to the location of the vehicle 100, the nearby charging stations in the vicinity of the stranded vehicle 100, and the amount of power required for the vehicle 100 to reach the closest charging station 120. In receiving such data, the controller 300 then proceeds to block 404 to detect other electric vehicles in the vicinity of the stranded vehicle 100 such that the other vehicles may be able to provide enough power for the vehicle 100 to reach the charging station 120.

For example, there may be a predetermined radius that defines the vicinity, or the threshold range 102, of the stranded vehicle 100. In one example, the location may be in an urban setting such as within the boundaries of a populous city with a high concentration of electric vehicles. In such a case, the predetermined radius may be small, for example less than 10 miles, because it is highly likely that one of the many electric vehicles in the region will be willing to help the stranded vehicle 100. However, in another example, the location may be in a suburban or rural setting, in which case the radius may need to be extended to 50 miles, for example, because there are very few electric vehicles nearby. As such, the controller 300 may determine how large the threshold range 102 may need to be based upon the location of the stranded vehicle 100.

In the next block 406, the controller 300 receives information regarding the other electric vehicles which it managed to find within the vicinity of the stranded vehicle 100. For illustrative purposes only, five other electric vehicles (104, 106, 108, 112, 116) are shown in FIG. 1, which are the vehicles recognized by the controller 300 to be a potential power source for the vehicle 100. Specifically, vehicles 104, 106, and 108 are relatively close by, for example within a 10-mile radius from the vehicle 100, while vehicle 112 is farther away, close to the edge of the threshold range 102, which in this case has a 50-mile radius. Additionally, vehicle 116 is much farther away than the rest of the vehicles at 200 miles from the stranded vehicle 100, but the controller 300 also recognizes, based upon the proprietary information of the vehicle 116, that the owner has a home 118 located just 10 miles from the stranded vehicle 100.

The controller 300 may also receive information regarding the SOC of the battery in each of the vehicles. For example, the SOC values of vehicles 106, 108, and 112 indicate that these vehicles will be able to travel at least 70 miles after they charge the battery of the stranded vehicle 100 to a certain SOC (that is, enough SOC for the vehicle 100 to reach the closest charging station 120 such that the vehicle 100 can then charge the battery more, as needed), but vehicle 104 is only able to travel 30 miles before the power runs out if the driver decides to use the vehicle 104 to charge the battery of the stranded vehicle 100.

Furthermore, the controller 300 may also receive information such as the predicted routes of each of the vehicles, and in the example shown, vehicles 108 and 112 are known to be traveling in a certain direction. Or more specifically, the vehicle 108 is traveling away from the stranded vehicle 100 in the first direction 110 and the vehicle 112 is traveling toward the stranded vehicle 100 in the second direction 114. The controller 300 may also receive information regarding any time constraints that the drivers of the vehicles may have, such as a scheduled meeting or appointment to make within a limited time frame. In this example, the driver of the vehicle 106 is known to be commuting to work at the time the vehicle 100 is stranded and therefore is in a rush to arrive at his or her workplace.

Subsequently, in block 408, the controller 300 determines which of the vehicles (104, 106, 108, 112, 116) to send the "power source requests" based upon the information received in block 406. After determining, the controller 300 then sends the requests to the vehicle(s) in block 410. After receiving the requests, the drivers of the vehicles have the option to agree to charge the battery of the stranded vehicle 100 or to refuse. If agreed, the drivers can then indicate to the driver of the stranded vehicle 100 how much their charging rate would be to compensate the drivers who assist the stranded driver. In some embodiments, the controller 300 determines the charging rate based upon the availability of electric vehicles in the vicinity whose drivers are willing to let other drivers use as a power source. Therefore, the controller 300 would set the charging rate higher (for example, 30 cents per kilowatt) if fewer vehicles are available to assist, and lower (for example, 10 cents per kilowatt) if many more vehicles are available.

Figure 5:
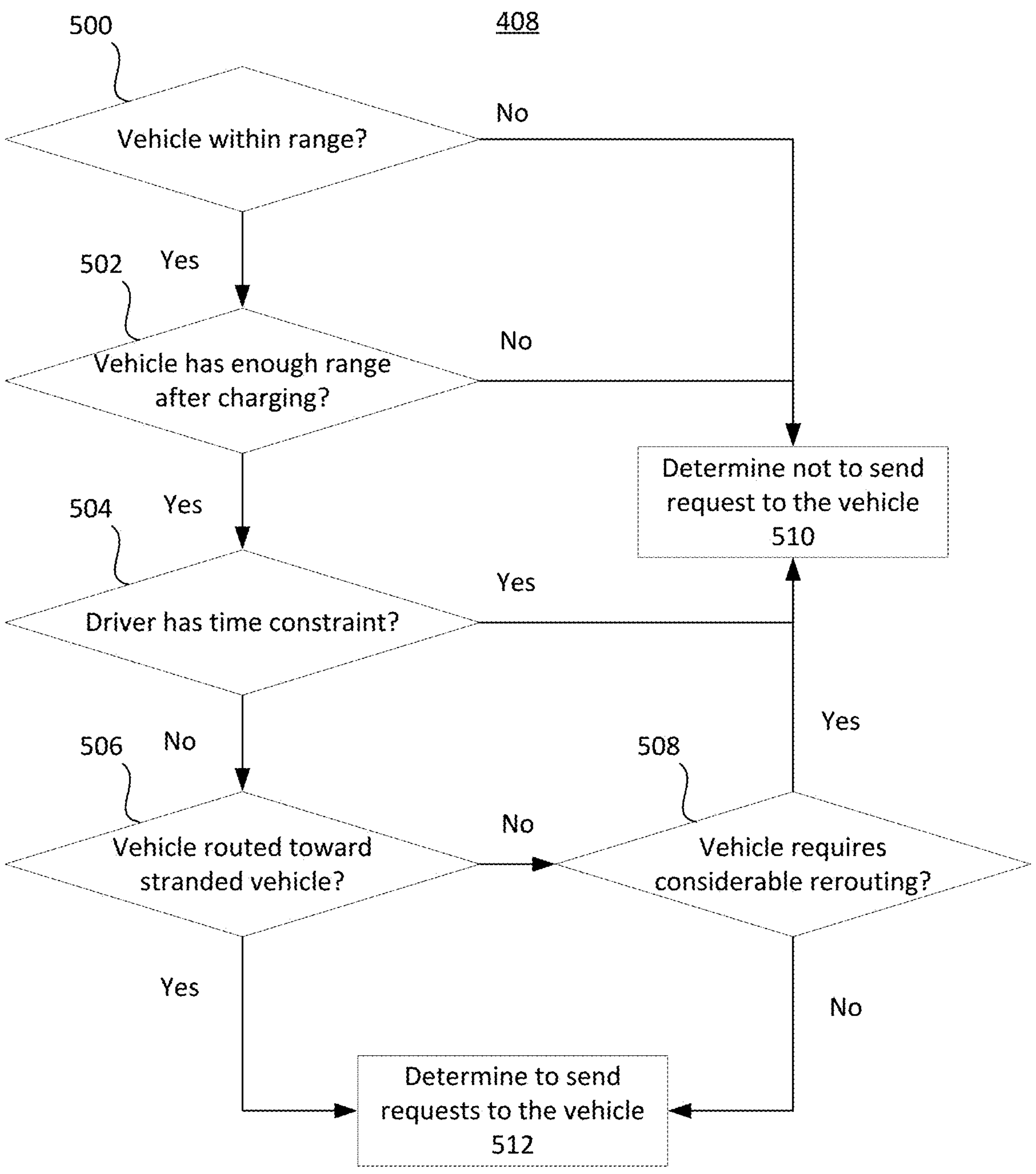
FIG. 5 depicts an exemplary flow diagram of one example step in the computer-implemented method performed by a controller of the server shown in FIG. 4.

FIG. 5 shows an exemplary block 408 implemented in the method 400 that is used by the controller 300 of the server 212 according to some embodiments. In the first step 500, the controller 300 determines if the detected vehicles are within the threshold range 102 from the stranded vehicle 100. In some examples, this step may be skipped because the controller 300 only detects vehicles that are already within the threshold range 102 in block 402 as shown in FIG. 4. In this example, the vehicle 116 is indicated as being more than 200 miles away from the stranded vehicle 100, so the processor 300 determines not to send requests to the vehicle 116 in block 510.

If the vehicle is in the threshold range 102, which is the case for vehicles 104, 106, 108, and 112, the controller 300 proceeds to the next step 502 to determine if the vehicle's battery has enough SOC (e.g., a threshold SOC) after charging the battery of the stranded vehicle 100. As previously mentioned, the vehicle 104 is able to travel 30 miles before the power runs out after charging the battery of the stranded vehicle 100, while the other vehicles can travel 70 miles or more. Therefore, with regard to the vehicle 104, there would not be sufficient range of operation in the battery to allow for the charging of another vehicle's battery, so the controller 300 would determine not to send requests to the vehicle 104, according to block 510. However, for the rest of the vehicles 106, 108, and 112, the controller 300 would proceed to block 504.

In block 504, the controller 300 determines if the driver of each vehicle is under a time constraint. The driver of the vehicle 106 may be known to be commuting to work at the time the vehicle 100 is stranded. This information may be obtained by synchronizing the database 310 with a scheduling software used by the driver of the vehicle 106 so that the controller 300 would have access to the driver's scheduled routes during the day. Because the controller 300 recognizes that the driver does not have time to stop by and assist the stranded vehicle 100, the controller 300 would again determine not to send requests to the vehicle 106, according to block 510. Alternatively, the driver may opt out of such "power source requests" and indicate his or her status as such so that when the controller 300 accesses the driver's information, the controller 300 would automatically proceed to block 510 for this driver and move on to the next vehicle on the list.

Now, the controller 300 has the vehicles 108 and 112 remaining on the list. In the next block 506, the controller 300 determines if the vehicle is traveling in a general direction toward the stranded vehicle 100. As used herein, the "general direction" may refer to a direction that enables another vehicle to come within a predetermined distance from the stranded vehicle 100. For example, a vehicle may be traveling on a road or highway on which the vehicle 100 is parked, or the vehicle may come within a 5-mile (or 7-mile, 3-mile, 2-mile, 1-mile, or any other range as deemed appropriate) radius from the stranded vehicle 100 at the current route.

In this respect, vehicle 108 is shown to be traveling away from the stranded vehicle 100, and vehicle 112 is shown to be traveling toward the general direction of the stranded vehicle 100 and would likely pass by the vehicle 100 en route. However, it is also shown that the vehicle 108 is much closer to the stranded vehicle 100 than the other vehicle 112. In this case, the controller 300 proceeds to block 512 and sends the request to the more distant vehicle 112. The controller 300 also proceeds to step 508 and determines whether the other closer vehicle 108 would require considerable rerouting in order to arrive at the stranded vehicle 100. Using a mapping software that is readily available via the network 210, the controller 300 determines a route that the driver of the vehicle 108 can take if he or she decides to assist the stranded vehicle 100. If, based upon the mapping data analysis, the controller 300 determines that doing so would incur an undue burden on the driver (for example, due to detours caused by road constructions or accidents, complications in rerouting caused by too many one-way streets or highways, or increase in the traffic load leading to heavy traffic on the way, and so on), the controller 300 may determine to proceed to block 510 and not send the request.

Otherwise, the controller 300 proceeds to block 512 and sends the request to the vehicle 108 as well.

An example of using an exemplary vehicle charging management system implementing an exemplary computer-implemented method, as disclosed herein, is explained. If Driver "1" gets stranded on the side of the road with no battery power, Driver 1 will send out a request for power. The application may determine how much power Driver 1 will need to get to the next charging station. The application will then look for drivers in the area who have extra power. The application may determine:

Driver 2 is closest but will only have sufficient power for an additional 30 miles (or less) of driving when the driver gets to his or her destination.

Driver 3 is the next closest and has plenty of power, but Driver 3 has set a preference that he/she not be asked to help during the trip to work in the morning, so Driver 3 is also skipped.

Driver 4 is 50 miles away, but his/her route is going to take him/her right next to driver 1 with a small re-route and the request is sent to Driver 4.

Driver 5 is only 10 miles away on a route that does not go by Driver 1, but a request is sent to Driver 5 as well.

Because there are only 2 drivers that could help Driver 1, there will be a slight premium for power. Normal charging rates for this area may be 10 cents per kilowatt, but because there are only two drivers available, the rate that Driver 1 would be charged would be, for example, 30 cents per kilowatt. If there were more drivers that could help out, this could be reduced, but the rate would always be over the standard charging rate to help compensate the drivers who help out.

In some examples, the vehicle of Driver 1 that is being charged shares with the owner of the charging unit (e.g., Driver 4 or 5 in the above scenario) the beginning state of charge level at which the vehicle was when it was first plugged in, as well as the final state of charge level at the time Driver 1 leaves after charging. This difference between the two state of charge levels will determine the total number of kilowatts charged to the vehicle of Driver 1, thereby assisting the calculation of how much Driver 1 should be charged.

Furthermore, this application may link the drivers in need with drivers who have chargers at their homes. It may be similar to AIRBNB for charging cars. The driver needing power would request a charging station near them, the application may show the available public charging stations along with charging stations that individuals have opened up to the application. So as an example, Driver 1 might be low on power, and will not make it to the next charging station, but Driver 6 who happens to be over 100 miles away visiting family, lives near the current location of Driver 1. Driver 1 may be given the opportunity to visit Driver 6's house and charge at that location, and again a slightly higher price than Driver 6 pays the power company to ensure Driver 6 is rewarded for opening up their charger.

With the present embodiments, for future state when cars are level 5, there could be "charging" transportation vehicles. These vehicles could be stationed at certain locations to help stranded motorists.

Stranded vehicles will likely become more and more of a problem as more electric cars flood the city streets, and currently there are very few good long-term solutions. The application could also help crowd source a solution which can help drive adoption of electric cars.

Also, an insurance provider may offer an insurance rider to help with running out of power. Much like roadside assistance, if a customer runs out of battery power this version of roadside assistance for electric vehicles would either tow the customer's vehicle to a local charging station, or would offer a two-way charging solution on the side of the road as part of their policy. This would help offer peace of mind for customers who have range anxiety.

Figure 6:
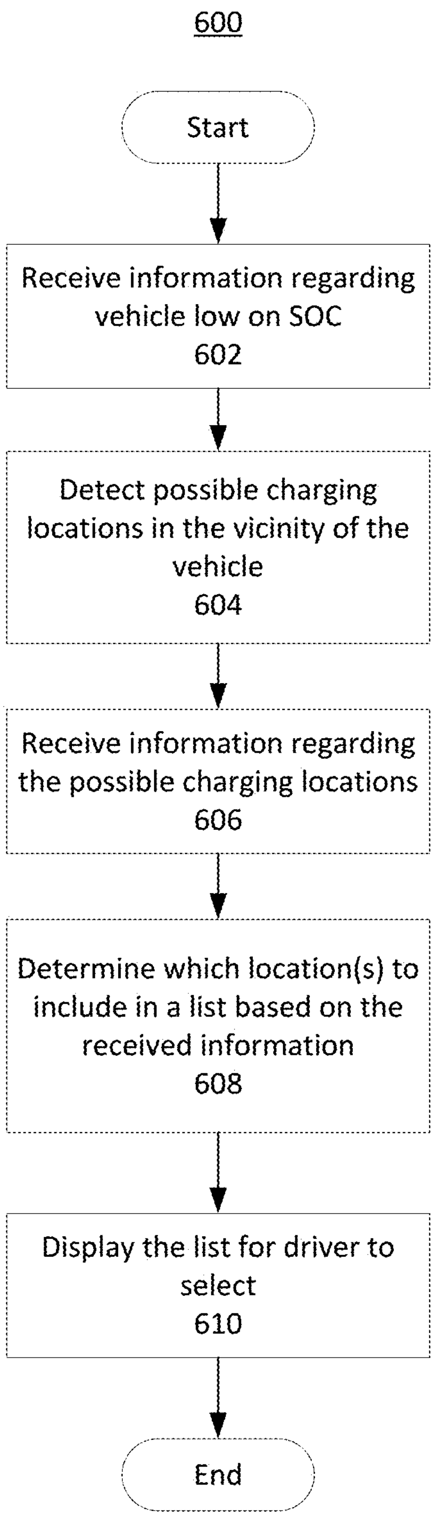
FIG. 6 depicts an exemplary flow diagram of a computer-implemented method performed by a controller of the server according to one embodiment as disclosed herein.

FIG. 6 shows an exemplary computer-implemented method 600 used by the controller 300 of the server 212 according to some embodiments to send "power source requests" for one or more owners of charging locations to allow the electric vehicle 100, which is low on SOC, to charge the battery at the charging locations. In this situation, the "charging locations" refer to locations with electric vehicle charger(s) owned by private entities that are open for other drivers of electric vehicles to use. For example, the charging locations may be in the garage of a home 118 in a residential area, as opposed to the charging stations 120 typically located at parking lots.

Therefore, the method 600 allows for anyone with an electric vehicle charger to offer the charger to other drivers to use when the charger is not being used, for example during the day when the owner of the house is away at work. Unlike in the method 400, this method 600 only applies to vehicles 100 with a low SOC, not a vehicle that is stranded because of no power left in the battery, since the vehicle 100 would still need to be able to travel to the available charging location to use the charger.

In the first block 602, the controller 300 receives information regarding the electric vehicle 100 that is low on SOC. For example, when the sensors 208 measure a low SOC that would not enable the vehicle 100 to travel to its intended destination, the processing unit 202 of the vehicle 100 may send an alert signal to the server 212 via the network 210 so that the controller 300 of the server 212 would find a nearby location that would allow the vehicle 100 to be charged.

In block 604, the controller 300 detects possible charging locations in the vicinity of the vehicle 100 based upon the information stored in the database 310. In the example shown in FIG. 1, the home 118 belongs to an owner of the vehicle 116 who is away on vacation (and hence the vehicle 116 is located so far away from home 118) and the owner is offering a charger for use by other drivers while the owner is away. The home 118 is located closer to the vehicle 100 than the closest charging station 120.

Therefore, if the vehicle 100 is to travel to the charging station 120, the driver may risk running out of power completely before reaching the charging station 120. In this case, the controller 300 proceeds to block 606 to receive information regarding the home 118 that has the charger. Information may include, for example, the traffic condition between the location of the vehicle 100 and the home 118 as well as whether the charger at the home 118 is currently being used to charge another electric vehicle, and so on.

In block 608, the controller 300 determines which location(s) to include in a list of potential charging locations based upon the received information. It should be understood that although only one home 118 is shown, there may be a plurality of other locations that offer chargers for use, and the controller 300 would analyze data regarding each location to determine the ones that may potentially be the power source.

Lastly, in block 610, the list of potential charging locations is displayed for the driver of the vehicle 100 to select. In some examples, the list also shows a score of the home 118 as rated by drivers who have previously used the charger at the home 118 so assist the driver of the vehicle 100 in the selection process. After the driver selects the location, a notification may be sent to the owner of that location so the owner is made aware that another driver is using the charger.

Figure 7:
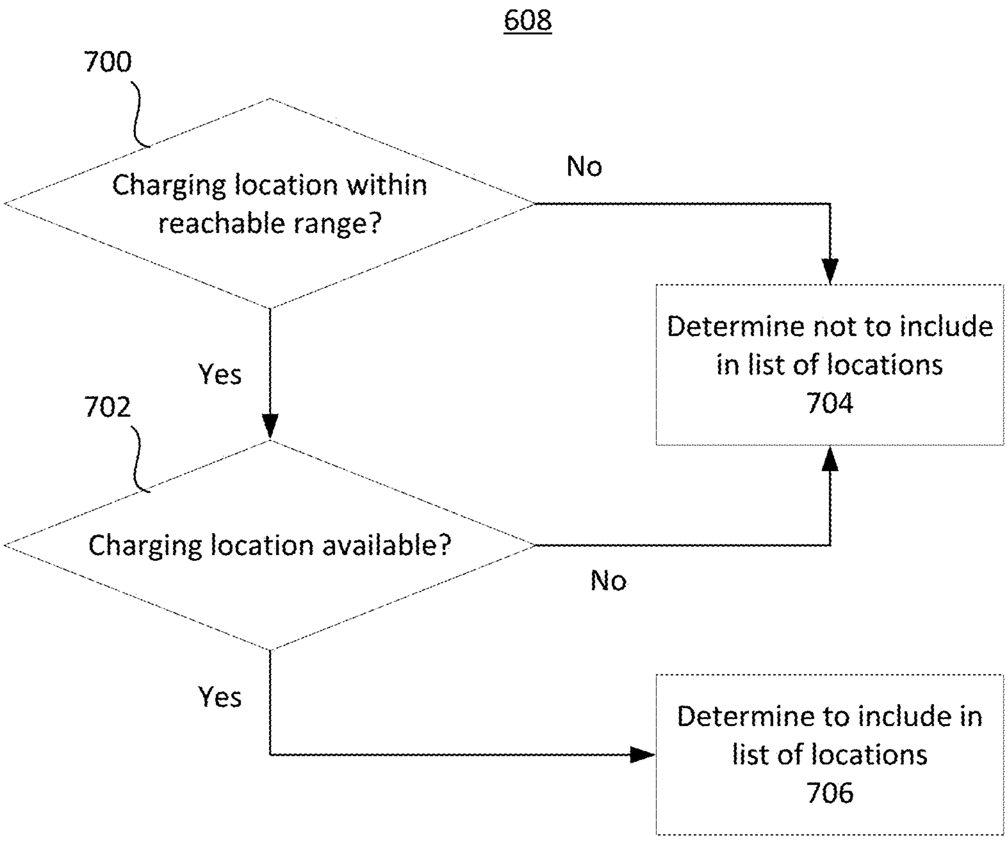
FIG. 7 depicts an exemplary flow diagram of one example step in the computer-implemented method performed by a controller of the server shown in FIG. 6.

FIG. 7 shows an exemplary block 608 implemented in the method 600 that is used by the controller 300 of the server 212 according to some embodiments. In the first step 700, the controller 300 determines if the detected vehicles are within a reachable range from the vehicle 100 that is low on SOC. This reachable range is determined based upon the remaining SOC and a performance history of the vehicle 100.

Specifically, if the database 310 indicates that the vehicle 100 was previously capable of traveling 10 miles at the current SOC, for example, the reachable range may be set at 10 miles from the current location of the vehicle 100. As such, if the home 118 is located more than 10 miles from the current location, the controller 300 proceeds to block 704 and determines not to include the house 118 in the list of potential charging locations. Otherwise, the controller 300 proceeds to step 702 to determine if the charger at the home 118 is available for use by the vehicle 100.

If no one is using the charger and the owner of the home 118 will not be coming back to use the charger in the near future (for example, within the next 30 minutes or any amount of time that is shorter than the amount of time necessary for the battery of the vehicle 100 to be charged to a predetermined SOC), then the controller 300 proceeds to step 706 and determines to include the home 118 in the list of potential charging locations.

In some cases, the charger is already being used by another electric vehicle, so the controller 300 then decides if the driver of the vehicle 100 should wait at the home 118 or if another potential charging location should be considered. The decision is based upon how long it will take for the battery of the other vehicle to be charged to a sufficient SOC as determined by the system. If a second vehicle is waiting at the home 118 to use the charger after the driver who is currently using it, the controller 300 may decide not to include the home 118 in the list and suggest an alternate location for the driver to charge the vehicle 100.

In some embodiments, if the driver of the vehicle 100 that has the low SOC is willing to wait, the controller 300 may put the vehicle 100 on a waiting list for the use of the occupied charger at the home 118. This allows for the driver of the vehicle 100 to reserve a time slot to use the charger, thereby eliminating the need to find an alternate location.

It should be understood that although the computer-implemented methods in FIGS. 4 through 7 are described as performed by the controller 300 of the remote server 212, in some examples, such methods may be performed on the spot by the processing unit 202 of the vehicle 100 that needs to be charged, by functionally coupling the processing unit 202 with the server 212 or its database 310 via the network 210. In some examples, the processing unit 202 of the vehicle 100 or the controller 300 of the server 212 has artificial intelligence capabilities that perform machine learning based upon historical data obtained by collecting and analyzing past transactions or performances.

Advantages in the methods as explained herein include the ability for drivers of electric vehicles to help other drivers of electric vehicles in need, creating a system that enables a crowd-source solution to alleviate the problem of “range anxiety” experienced by many drivers of electric vehicles. Although it would take longer to charge the battery from another electric vehicle than using the charging stations, drivers can travel with ease knowing that they have alternative means of charging their electric vehicles when they experience a low SOC in the vehicles’ batteries. Also, the system as explained herein creates a business model for an owner of an electric vehicle to earn money by letting other drivers use the owner’s electric vehicle or charger(s) at home to charge their electric vehicles.

Exemplary Features

The future of transportation is most likely electric or alternative energy. These vehicles create a unique problem for the industry, unlike gas powered cars, these vehicles cannot just get a can of gas brought to them when they run out of energy. There will have to be an alternative solution for when people run out of battery power in the future. This may lead to a term called “Range Anxiety” when a customer is worried that they can’t get to their destination or next charging station before they run out of battery power.

Currently most cars only have one-way charging. However, two-way charging is becoming more common place in phones. The present embodiments may include using two-way charging for battery powered cars to help customers who run out of power in their electric car. The present embodiments may utilize an application that links alternative energy customers through a phone application. In the event that a customer is running out of battery power with no charging station nearby, the customer may send a request for a “power source.” This request may then be sent to people who own alternative power cars, and give them the opportunity to help the person who is running out of battery power by sharing their battery power.

Unique aspects of this application include taking into account several factors that would help the stranded (or soon to be stranded) driver be better matched with the drivers with extra battery power, such as (1) the application may only send requests to people or vehicles within a certain radius of the stranded driver (or driver low on charge); (2) the application may link with the vehicles to know if any of the vehicles will be routed on the stranded driver’s road (or driver low on charge’s road); (3) the application may analyze the distance the other drivers are traveling, and the expected range and/or battery power they will have after the trip is completed; (4) the application may analyze and consider time constraints of the other drivers, as well as other factors; and/or (5) the application may also consider energy costs, and supply and demand when linking customers.

Exemplary Rendezvous with Recharging Vehicle

Figure 8:
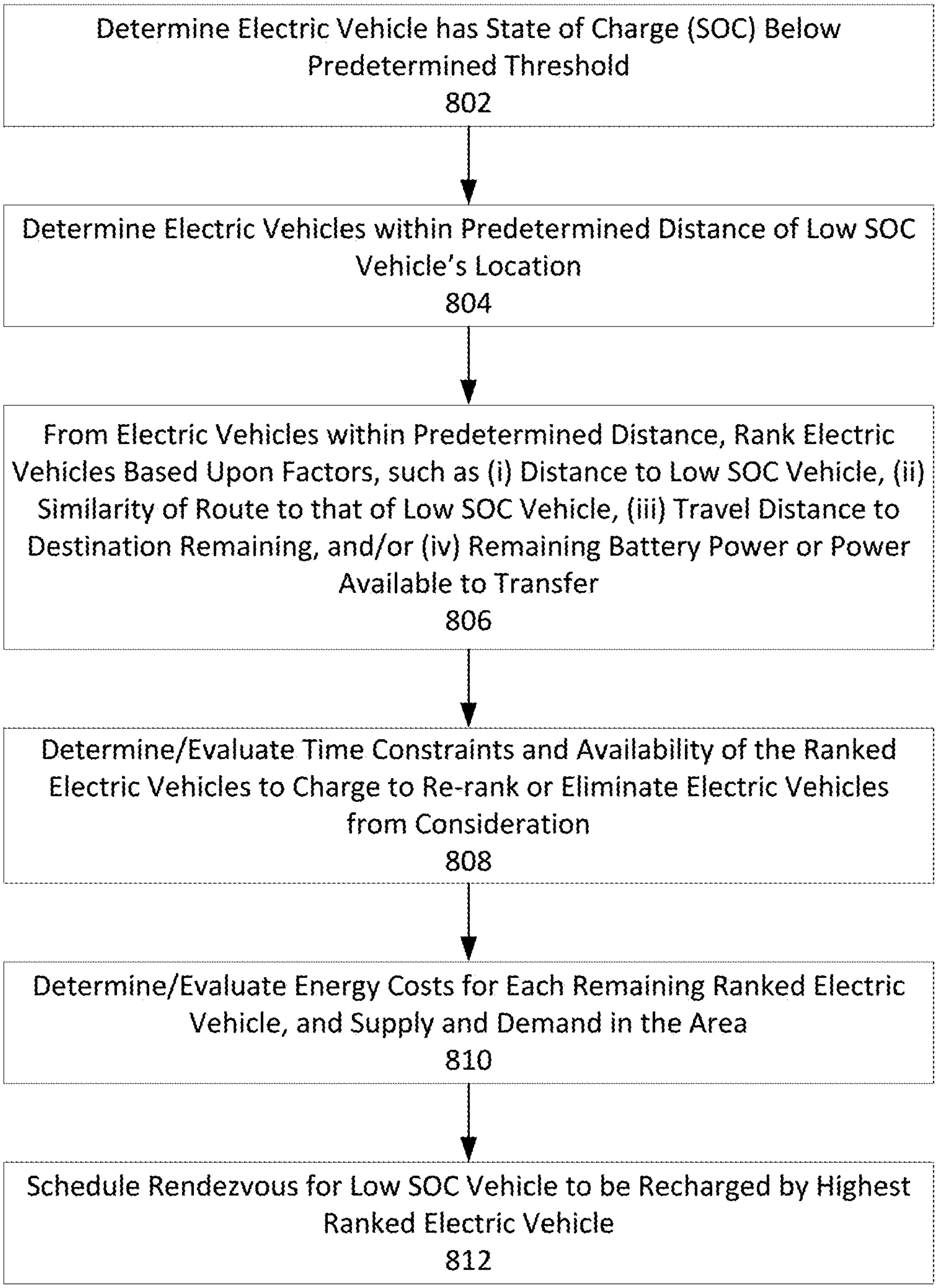
FIG. 8 illustrates an exemplary computer-implemented method for recharging the battery of an electric vehicle with a low state of charge involving identifying an electric vehicle in the vicinity with available battery power bandwidth to satisfy the traveling needs of both vehicles.

FIG. 8 illustrates an exemplary computer-implemented method for recharging the battery of an electric vehicle with a low state of charge (SOC) involving identifying an electric vehicle in the vicinity and with available battery power bandwidth to satisfy the traveling needs of both vehicles 800. The method may be implemented via one or more local or remote processors, transceivers, servers, and/or sensors.

The method 800 may include determining at step 802, via one or more processors, an electric vehicle having a battery with a state of charge (SOC) below a predetermined threshold. Such threshold may be defined as a percentage of the SOC remaining in the electric vehicle, such as 20%, 25%, 30%, etc., or as a distance that the electric vehicle is determined to be capable of traveling based upon the SOC remaining in the electric vehicle, such as 10 or 20 miles, etc. For instance, the low SOC electric vehicle, or a mobile device of person riding in the electric vehicle, may be configured to collect and analyze vehicle telematics data. The vehicle telematics data may include acceleration, braking, cornering, speed, direction, route, GPS (Global Positioning System) location, and other information, such as SOC or battery level data. The one or more processors (and/or low SOC vehicle or corresponding mobile device) may analyze the SOC or battery level data to determine that the SOC is below the predetermined threshold.

If the SOC is determined to be below a predetermined threshold, the method 800 may include determining at step 804, via the one or more processors, electric vehicles within the vicinity of, or a predetermined distance of, the low SOC vehicle's GPS location, such as within 5 miles, 10 miles, 20 miles, etc. In some examples, this predetermined distance may be approximately the same or less than the aforementioned distance that the electric vehicle is determined to be capable of traveling based upon the SOC remaining in the electric vehicle. For instance, the low SOC electric vehicle, or a mobile device of person riding in the electric vehicle, may be configured to receive telematics data from other electric vehicles in the vicinity, such as via V2x communication (e.g., vehicle-to-vehicle wireless communication or vehicle-to-mobile device wireless communication). The telematics data from the other electric vehicles may include a GPS location for each vehicle that may be compared with the GPS location of the low SOC vehicle or corresponding mobile device to determine whether any electric vehicles are within the predetermined distance of the low SOC vehicle.

The method 800 may include at step 806 ranking, from among the electric vehicles within the predetermined distance of the low SOC vehicle, via the one or more processors, the electric vehicles based upon various factors. For instance, the electric vehicles within the predetermined distance of the low SOC vehicle may be ranked based upon (a) distance to the low SOC vehicle, (b) similarity of route being traveled to the route of the low SOC vehicle; (c) travel distance to destination remaining; (d) remaining battery power or remaining miles based on current battery power; and/or (e) power available to transfer (such as determined from distance remaining to destination, or amount of power that would be "left over"). In some examples, the ranking may be further based upon one or more user reviews inputted by other owners or operators of electric vehicles who have previously used the electric vehicles to be ranked to charge their own vehicles, or a frequency at which other vehicles have used these vehicles for charging. In some aspects, the route being traveled by each electric vehicle, travel distance to destination information, remaining battery power information, and/or power available to transfer information may be contained in telematics data received by the low SOC vehicle or corresponding mobile device from the other electric vehicles, such as received via V2x wireless communication or data transmission over one or more radio frequency links.

The method 800 may include determining or evaluating at step 808, via the one or more processors, time constraints and/or the availability of the ranked electric vehicles to charge. For instance, vehicle and/or operator electronic calendars (or autonomous vehicle and/or passenger electronic calendars) may be retrieved and analyzed to find available times for charging the low SOC vehicle. In some embodiments, vehicle and/or operator electronic calendar data (or autonomous vehicle and/or passenger electronic calendar data) may be included in vehicle telematics data broadcasted from each vehicle or a corresponding passenger/driver mobile device via wireless communication or data transmission.

In some embodiments, the time constraints and/or availability information may include vehicle owner preferences, such as only to be available before or after work, in the morning, in the evening, or on the weekend. Additionally or alternatively, route information for each vehicle may be retrieved and analyzed to determine available locations for charging the low SOC vehicle. The time constraints and/or the availability of the electric vehicles may be used to re-rank the electric vehicles (after Step 806) or eliminate some electric vehicles from consideration.

The method 800 may include determining or evaluating at step 810, via the one or more processors, energy costs for each remaining ranked electric vehicle, and/or energy and charging supply and demand for the area through which the low SOC vehicle is traveling. For instance, energy costs associated with each ranked electric vehicle may be set by the vehicle owner. In some aspects, multiple vehicle owners may set their prices for energy retrieved from their vehicle batteries, or engage in a bidding process for available vehicles in need of recharging. In other aspects, the low SOC vehicle owner may bid on available electric vehicles in the vicinity to recharge their vehicle battery.

The method 800 may include scheduling at step 812, via the one or more processors and/or associated transceivers, a rendezvous for the low SOC vehicle with the highest, or one of the highest, remaining ranked electric vehicle for recharging the low SOC vehicle. The method 800 may include determining a convenient rendezvous location for both vehicles. If one or both vehicles are autonomous, the one or more processors may determine routes for each autonomous electric vehicle, and automatically route each electric vehicle to the rendezvous location. The method 800 may include additional, less, or alternate functionality, including that discussed elsewhere herein.

Exemplary Scheduling with Recharging Home

Figure 9:
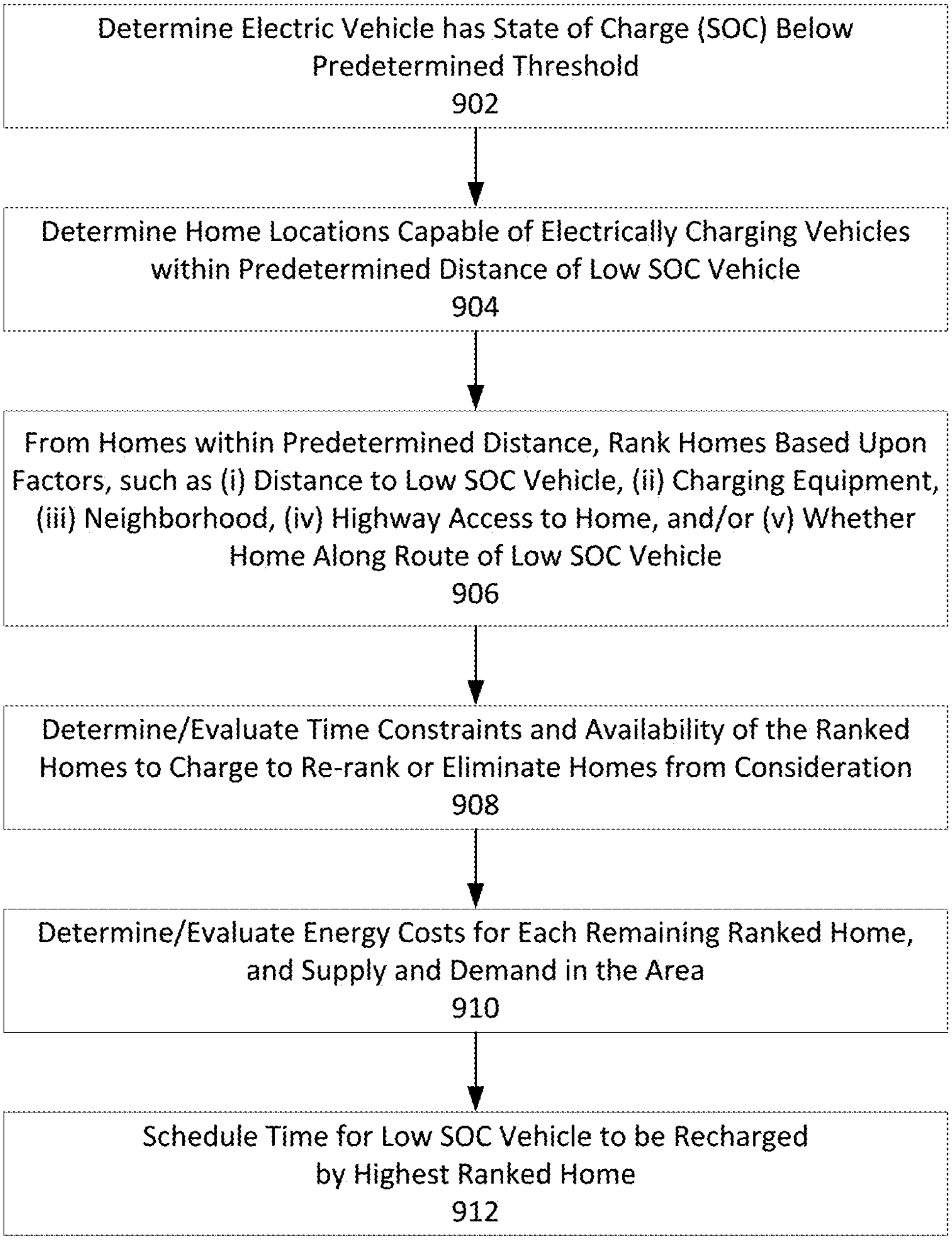
FIG. 9 illustrates an exemplary computer-implemented method for recharging the battery of an electric vehicle with a low state of charge involving identifying a home equipped to recharge electric vehicles in the vicinity that are available to charge the vehicle.

FIG. 9 illustrates an exemplary computer-implemented method 900 for recharging the battery of an electric vehicle with a low state of charge (SOC) involving identifying a home equipped to recharge electric vehicles in the vicinity and that are available to charge the vehicle. The method may be implemented via one or more local or remote processors, transceivers, servers, and/or sensors.

The method 900 may include determining at step 902, via one or more processors, an electric vehicle has a state of charge (SOC) below a predetermined threshold. Such threshold may be defined as a percentage of the SOC remaining in the electric vehicle, such as 20%, 25%, 30%, etc., or as a distance that the electric vehicle is determined to be capable of traveling based upon the SOC remaining in the electric vehicle, such as 10 or 20 miles, etc. For instance, the low SOC electric vehicle, or a mobile device of a person riding in the electric vehicle ("corresponding mobile device"), may be configured to collect and analyze vehicle telematics data. The vehicle telematics data may include acceleration, braking, cornering, speed, direction, route, GPS (Global Positioning System) location, and other information, such as SOC or battery level data. The one or more processors (and/or low SOC vehicle or corresponding mobile device) may analyze the SOC or battery level data to determine that the SOC is below the predetermined threshold.

If the SOC is determined to be below a predetermined threshold, the method 900 may include determining at step 904, via the one or more processors, homes capable of charging electric vehicles within the vicinity of, or a predetermined distance of, the low SOC vehicle's GPS location, such as within 5 miles, 10 miles, 20 miles, etc. In some examples, this predetermined distance may be the approximately the same or shorter than the aforementioned distance that the electric vehicle is determined to be capable of traveling based upon the SOC remaining in the electric vehicle. For instance, the low SOC electric vehicle, or a mobile device of a person riding in the electric vehicle, may be configured to receive home telematics or other data from homes in the vicinity, such as via wireless communication or data transmission. The home telematics data may include a GPS location for each home that may be compared with the GPS location of the low SOC electric vehicle or mobile device to determine whether any homes capable of charging electric vehicles are within the predetermined distance of the low SOC vehicle.

The method 900 may include at step 906 ranking, from among the homes within the predetermined distance of the low SOC vehicle, via the one or more processors, the homes based upon various factors. For instance, the homes within the predetermined distance of the low SOC vehicle may be ranked based upon (a) distance to the low SOC vehicle, (b) charging equipment; (c) neighborhood of home; (d) ease of access to the home, such as near a highway; and/or (e) whether the home is located along the route of the low SOC vehicle. Charging equipment data, type of neighborhood data, and ease of access to the home and/or to the charging equipment data may be included in the home telematics data broadcasted by each home via wireless communication or data transmission. In some examples, the ranking may be further based upon one or more user reviews inputted by other owners or operators of electric vehicles who have previously used the homes to charge their own vehicles, or a frequency at which other vehicles have used the homes for charging.

The method 900 may include determining or evaluating at step 908, via the one or more processors, time constraints and/or the availability of the ranked homes to charge. For instance, home owner electronic calendars may be retrieved and analyzed to find available times for charging the low SOC vehicle. In some embodiments, home owner electronic calendar data may be included in the home telematics data broadcasted by each home. The time constraints and/or the availability of the homes may be used to re-rank the homes (after step 906) or otherwise eliminate some homes from consideration.

The method 900 may include determining or evaluating at step 910, via the one or more processors, energy costs for each remaining ranked home, and/or energy and charging supply and demand for the area through which the low SOC vehicle is traveling. For instance, energy costs associated with each ranked home may be set by the home owner. In some aspects, multiple home owners may set their prices for energy retrieved from their homes, or engage in a bidding process for available vehicles in need of recharging. In other aspects, the low SOC vehicle owner may bid on available homes in the vicinity to recharge their vehicle battery.

The method 900 may include scheduling at step 912, via the one or more processors and/or associated transceivers, a rendezvous for the low SOC vehicle with the highest, or one of the highest, remaining ranked home for recharging the low SOC vehicle. The method 900 may include determining a convenient rendezvous time and schedule it.

The home telematics data broadcasted by each home may include home owner preferences for charging. For instance, the home owner may prefer to be at home while any charging takes place. Alternatively, the home owner may prefer not to be at home while any charging takes place, assuming the electric vehicle being charged has been vetted and determined to be trustworthy. In some aspects, the home telematics data may include home occupancy data detailing whether the home is currently occupied and/or times the home is scheduled to be occupied. Any charging occurring at the home may be scheduled to occur when the home is occupied or unoccupied based upon the home owner preferences.

In some examples, the charger installed at the home may have a switch installed thereon that automatically turns on and/or off the charging capability of the charger. For example, if the driver of the low SOC vehicle only intends to charge the vehicle for a predetermined cost of electricity that the driver is willing to pay or has pre-paid (e.g., the driver of the low SOC vehicle purchases $10 worth of electricity from the home before beginning to charge the vehicle), the system would automatically switch off the charger when the predetermined amount is reached, and thus the driver would not able to get more power than the amount that has been paid for. Such switch may also be advantageous in keeping other drivers from being able to use the charger if the charger is located outside the house or if the previous driver has left the garage of the house open. In some aspects, the predetermined cost may be indicated by the driver of the low SOC vehicle when reserving a time slot for the driver to use the charger at the selected home, and the driver may be billed later. In some aspects, the system may require that the predetermined cost may be first paid by the driver of the low SOC vehicle before the rendezvous may be finalized, i.e. the time slot may only be reserved upon successful prepayment of the electricity to be charged, in order to prevent people from abusing the system by, for example, reserving time slots without the intent to actually use the charger or reserving a longer time slot than is needed to sufficiently charge the vehicle.

Also, if the low SOC vehicle is autonomous, the one or more processors may determine a route for the autonomous low SOC vehicle, and automatically route the low SOC vehicle to the home. The method 900 may include additional, less, or alternate functionality, including that discussed elsewhere herein.

Exemplary Autonomous Recharging Vehicle

Figure 10:
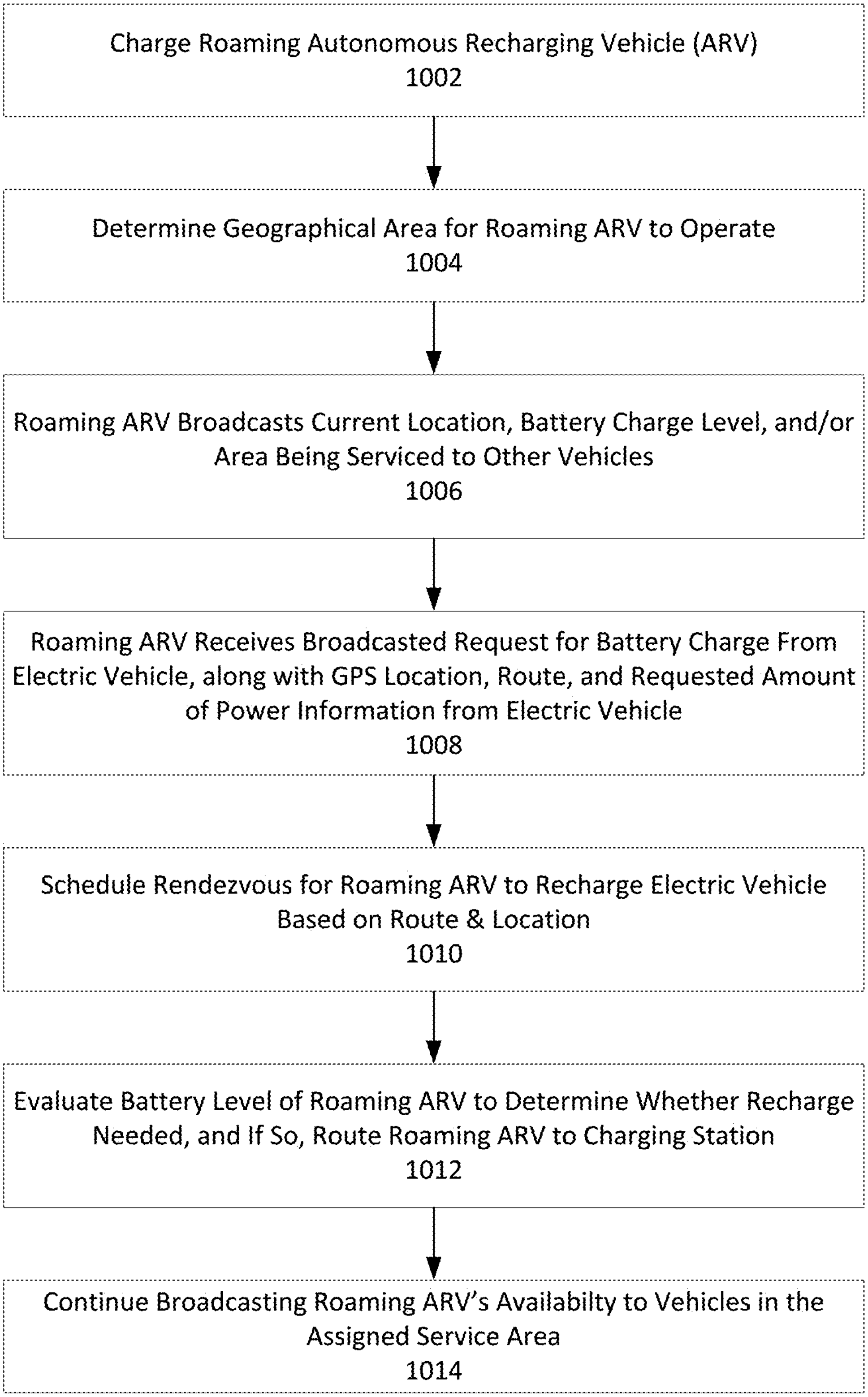
FIG. 10 illustrates an exemplary computer-implemented method for recharging electric vehicles via an autonomous recharging vehicle.

FIG. 10 illustrates an exemplary computer-implemented method for recharging electric vehicles via an autonomous recharging vehicle (ARV) 1000. The autonomous recharging vehicle may be an electric or hybrid autonomous or semi-autonomous vehicle, or otherwise have one or more batteries for recharging electric vehicles. The method may be implemented via one or more local or remote processors, transceivers, servers, and/or sensors.

The method 1000 may include at step 1002 charging an autonomous recharging vehicle (ARV). After being charged, the ARV may be assigned a geographical area in which to operate at step 1004. The ARV may be routed to roam about the assigned area, or wait at certain waypoints in the area.

The method 1000 may include broadcasting at step 1006, via the ARV and/or one or more associated processors and transceivers, the ARV's current GPS location, battery charge level, and/or area being serviced to other vehicles. For instance, ARV may broadcast telematics and other data to other vehicles in the vicinity via wireless communication or data transmission over one or more radio frequency links.

The method 1000 may include receiving at step 1008, via the ARV and/or one or more associated processors and transceivers, a request for a battery charge from an electric vehicle, such as via wireless communication or data transmission transmitted by the electric vehicle (or a corresponding mobile device) over one or more radio frequency links. The request may include telematics data of the electric vehicle and/or other data, such as GPS location, route information, and/or requested amount of battery charge/power.

The method 1000 may include scheduling at step 1010, via the ARV and/or one or more associated processors and transceivers, a rendezvous point for the ARV to recharge the electric vehicle. The rendezvous point may be determined based upon current route and location of both the electric vehicle and the ARV.

The method 1000 may include evaluating at step 1012, via the ARV and/or one or more associated processors and transceivers, the battery level of the ARV after recharging the electric vehicle has been completed. If the ARV's battery or batteries are in need of recharging, a route to a recharging station may be determined, and the ARV automatically routed to the recharging station.

The method 1000 may include continuing to broadcast at step 1014, via the ARV and/or one or more associated processors and transceivers, the ARV's availability for recharging, along with telematics data (such as location and route data), to vehicles in the geographical area being serviced. In some examples, the ARV may temporarily halt the broadcast when recharging or charging an electric vehicle, such that the lack of broadcasting would indicate the unavailability of the ARV for charging other vehicles.

In some examples, the ARV may have a list of potential electric vehicles waiting in queue for charging. The list may be filled on a first-come-first-serve basis, or the list may be arranged in an order determined by the one or more local or remote processors, transceivers, and/or servers. For example, the one or more processors may perform an optimization algorithm to optimize the efficiency of the ARV such that the ARV can most quickly finish charging all the electric vehicles on the list (e.g., based upon the vehicles' locations and intended routes), or the ARV can finish charging the electric vehicles by traveling the shortest distance (e.g., in view of a map of the area). The one or more processors may then rearrange the order of the vehicles on the list based upon the result of the optimization algorithm. In some examples, weather, traffic load, road conditions, and/or other factors may affect the time and distance traveled by the ARV to finish charging all the vehicles, and the one or more processors may obtain such information from other processors, servers, or database as needed, in or near real-time.

In some examples, the order of the electric vehicles on the list may be rearranged according to the schedules of the owners or operators of the vehicles. In some examples, the rearranging of the order may be based upon the SOC remaining in each of the electric vehicles (e.g., a vehicle with a lower SOC is given priority compared to another vehicle with a higher SOC). In some examples, the method takes into account whether the ARV needs to be recharged between charging other vehicles, and if so, the amount of time needed to finish recharging the ARV for the ARV to reach a sufficient SOC to resume charging the other vehicles. Furthermore, the list may be ordered and rearranged based upon two or more of the aforementioned factors, with each factor assuming different weights in the optimization algorithm (e.g., in the case of a multi-objective optimization). The method may include additional, less, or alternate functionality, including that discussed elsewhere herein.

Exemplary Computer-Implemented Methods

In one aspect, a computer-implemented method for recharging the battery of an electric vehicle with a low state of charge (SOC) involving identifying an electric vehicle in the vicinity and with available battery power bandwidth to satisfy the traveling needs of both vehicles may be provided. The method may be implemented via one or more local or remote processors, transceivers, servers, and/or sensors (such as battery power level sensors). The method include (i) determining, via one or more processors, an electric vehicle has a state of charge (SOC) below a predetermined threshold; (ii) if the SOC is determined to be below a predetermined threshold, determining, via the one or more processors, electric vehicles within the vicinity of, or a predetermined distance of, the low SOC vehicle's GPS location; (iii) from among the electric vehicles within the predetermined distance of the low SOC vehicle, ranking, via the one or more processors, the electric vehicles based upon various factors; and/or (iv) scheduling a rendezvous for the low SOC vehicle with the highest ranked electric vehicle for recharging the low SOC vehicle. The method may include additional, less, or alternate functionality, including that discussed elsewhere herein.

For instance, the method may include determining or evaluating, via the one or more processors, time constraints and/or the availability of the ranked electric vehicles to charge. The method may also include determining or evaluating, via the one or more processors, energy costs for each ranked electric vehicle and the energy and/or charging supply and demand for the area through which the low SOC vehicle is traveling.

In some aspects, telematics data including battery level data may be analyzed, via the one or more processors, to determine that the electric vehicle has a state of charge (SOC) below the predetermined threshold. The electric vehicles within the predetermined distance of the low SOC vehicle may be ranked based upon (a) distance to the low SOC vehicle, (b) similarity of route being traveled to the route of the low SOC vehicle; (c) travel distance to destination remaining; (d) remaining battery power or remaining miles based on current battery power; and/or (e) power available to transfer.

Additionally or alternatively, the route being traveled by each electric vehicle, travel distance to destination information, remaining battery power information, and/or power available to transfer information may be contained in telematics data received by the low SOC vehicle or a corresponding mobile device and transmitted by each electric vehicle. Route information for each vehicle is retrieved and analyzed to determine available locations for charging the low SOC vehicle.

In another aspect, a computer-implemented method for recharging the battery of an electric vehicle with a low state of charge (SOC) involving identifying a home equipped to recharge electric vehicles in the vicinity and that are available to charge the vehicle may be provided. The method may be implemented via one or more local or remote processors, transceivers, servers, and/or sensors (including batter power level sensors). The method may include (i) determining, via one or more processors, an electric vehicle having a state of charge (SOC) below a predetermined threshold; (ii) if the SOC is determined to be below a predetermined threshold, determining, via the one or more processors, homes capable of charging electric vehicles within the vicinity of, or a predetermined distance of, the low SOC vehicle's GPS location; (iii) from among the homes within the predetermined distance of the low SOC vehicle, ranking, via the one or more processors, the homes based upon various factors; and/or (iv) scheduling, via the one or more processors and/or associated transceivers, a rendezvous or appointment for the low SOC vehicle with the highest ranked home for recharging the low SOC vehicle. The method may include additional, less, or alternate functionality, including that discussed elsewhere herein.

For instance, the homes within the predetermined distance of the low SOC vehicle may be ranked based upon (a) distance to the low SOC vehicle, (b) charging equipment; (c) neighborhood of home; (d) ease of access to the home, such as near a highway; and/or (e) whether the home is located along the route of the low SOC vehicle. Charging equipment data, type of neighborhood data, and ease of access to the home and/or to the charging equipment data may be included in home telematics data broadcasted by each home via wireless communication or data transmission.

The method may include determining or evaluating, via the one or more processors, time constraints and/or the availability of the ranked homes to charge. The method may include determining or evaluating, via the one or more processors, energy costs for each remaining ranked home. The method may further include determining or evaluating, via the one or more processors, energy and charging supply and demand for the area through which the low SOC vehicle is traveling.

In some aspects, the low SOC vehicle is autonomous, and the one or more processors may determine a route for the autonomous low SOC vehicle, and then automatically route the low SOC vehicle to the home.

In another aspect, a computer-implemented method for recharging electric vehicles via an autonomous recharging vehicle (ARV) may be provided. The autonomous recharging vehicle may be an electric or hybrid autonomous or semi-autonomous vehicle, or otherwise have one or more batteries for recharging electric vehicles. The method may be implemented via one or more local or remote processors, transceivers, servers, and/or sensors. The method may include: (i) charging, via one or more processors or manually, an autonomous recharging vehicle (ARV); (ii) after being charged, assigning, via the one or more processors, the ARV to a geographical area in which to operate; (iii) broadcasting, via the ARV and/or one or more associated processors and transceivers, ARV current GPS location, battery charge level, and/or area being serviced to other vehicles capable of wireless communication or data transmission; (iv) receiving, via the ARV and/or one or more associated processors and transceivers, an electronic request for a battery charge from an electric vehicle, such as via wireless communication or data transmission transmitted by the electric vehicle (or a corresponding mobile device) over one or more radio frequency links; and/or (v) scheduling, via the ARV and/or one or more associated processors and transceivers, a rendezvous point for the ARV to recharge the electric vehicle. The method may include additional, less, or alternate actions, including those discussed elsewhere herein.

For instance, the electronic request may include telematics data of the electric vehicle and/or other data, such as GPS location, route information, and/or requested amount of battery charge/power. The rendezvous point for the ARV to recharge the electric vehicle may be determined based upon current route and location of both the electric vehicle and the ARV.

The method may include evaluating, via the ARV and/or one or more associated processors and transceivers, the battery level of the ARV after recharging the electric vehicle has been completed. The method may include determining, via the ARV and/or one or more associated processors and transceivers, a route to a recharging station, and automatically routing the ARV to the recharging station.

Exemplary Computer Systems

In one aspect, a computer system configured to recharge the battery of an electric vehicle with a low state of charge (SOC) may be provided. The computer system may include one or more local or remote processors, transceivers, servers, and/or sensors configured to: (1) determine an electric vehicle has a state of charge (SOC) below a predetermined threshold; (2) if the SOC is determined to be below the predetermined threshold, determine homes capable of charging electric vehicles within a vicinity of, or a predetermined distance of, the low SOC vehicle's GPS location; (3) from among the homes within the predetermined distance of the low SOC vehicle, rank the homes based upon various factors; and/or (4) schedule a rendezvous or appointment for the low SOC vehicle with the highest ranked home for recharging the low SOC vehicle, the highest ranked home being equipped to recharge the low SOC vehicle and is available to charge the low SOC vehicle. The system may include additional, less, or alternate functionality, including that discussed elsewhere herein.

For instance, the computer system may be further configured to collect and analyze, by a mobile device associated with the low SOC vehicle, vehicle telematics data. The vehicle telematics data may include one or more of: acceleration, braking, cornering, speed, direction, route, GPS location, and SOC of the low SOC vehicle.

The predetermined threshold may be defined as a percentage of the SOC remaining in the electric vehicle. Additionally or alternatively, the predetermined threshold may be defined as a determined distance that the electric vehicle is capable of traveling based upon the SOC remaining in the electric vehicle.

Each of the homes within the predetermined distance of the low SOC vehicle may be ranked based upon (a) distance to the low SOC vehicle, (b) charging equipment; (c) neighborhood of the home; (d) ease of access to the home, such as near a highway; and/or (e) whether the home is located along the route of the low SOC vehicle. The computer system charging equipment data, type of neighborhood data, and ease of access to the home and/or to the charging equipment data may be included in home telematics data broadcasted by each home via wireless communication or data transmission.

The computer system may be further configured to: determine or evaluate, via one or more processors, time constraints and/or availability of the ranked homes to charge. The time constraints and/or the availability is determined by collecting home owner electronic calendar data broadcasted by each of the homes. The home owner electronic calendar data may include home owner charging preference data and/or home occupancy data.

The computer system may be configured to re-rank or eliminate one or more of the ranked homes based upon the determined or evaluated time constraints and/or availability. The computer system may be configured to determine or evaluate, via the one or more processors, energy costs for each remaining ranked home.

The computer system may further configured to determine or evaluate, via the one or more processors, energy and charging supply and demand for the area through which the low SOC vehicle is traveling. The computer system may be configured to initiate, by the one or more processors, a bidding process for a driver of the low SOC vehicle to bid on the homes in the vicinity. The low SOC vehicle may be autonomous (or semi-autonomous), and the one or more processors may determine a route for the autonomous low SOC vehicle, and automatically route the low SOC vehicle to the home.

In another aspect, a computer system configured to recharge electric vehicles via an autonomous recharging vehicle (ARV) may be provided. The computer system may include comprising one or more local or remote processors, transceivers, servers, and/or sensors configured with the following functionality. For instance, the computer system may be configured to: (1) charge, via the one or more processors or manually, an autonomous recharging vehicle (ARV), the ARV being an electric or hybrid autonomous vehicle, or otherwise having one or more batteries for recharging electric vehicles; (2) after being charged, assign the ARV to a geographical area in which to operate; (3) broadcast, via the ARV and/or one or more associated processors and transceivers, ARV current GPS location, battery charge level, and/or area being serviced to other vehicles capable of wireless communication or data transmission; (4) receive, via the ARV and/or one or more associated processors and transceivers, an electronic request for a battery charge from an electric vehicle, such as via wireless communication or data transmission transmitted by the electric vehicle (or a corresponding mobile device) over one or more radio frequency links; and/or (5) schedule, via the ARV and/or one or more associated processors and transceivers, a rendezvous point for the ARV to recharge the electric vehicle. The computer system may include additional, less, or alternate functionality, including that discussed elsewhere herein.

For instance, the broadcasting may be performed via wireless communication or data transmission over one or more radio frequency links. The electronic request may include telematics data of the electric vehicle and/or other data, such as GPS location, route information, and/or requested amount of battery charge/power.

The rendezvous point for the ARV to recharge the electric vehicle may be determined based upon current route and location of both the electric vehicle and the ARV. The computer system may be further configured to evaluate, via the ARV and/or one or more associated processors and transceivers, the battery level of the ARV after recharging the electric vehicle has been completed. The computer system may be further configured to determine, via the ARV and/or one or more associated processors and transceivers, a route to a recharging station, and automatically routing the ARV to the recharging station.

The computer system may be configured to, after recharging the electric vehicle, resume broadcasting, via the ARV and/or the one or more processors and transceivers, telematics data (such as location and route data) and availability of the ARV for recharging, to the electric vehicles in the area being serviced. The computer system may be configured to manage, by the one or more processors, a list of potential electric vehicles waiting in queue for charging.

The computer system further configured to perform, by the one or more processors, optimization algorithm to rearrange an order of the electric vehicles on the list to optimize efficiency of the ARV. The computer system may be configured to rearrange, by the one or more processors, an order of the electric vehicles on the list based upon the schedules of the owners or operators of the electric vehicles. The computer system may be configured to rearrange, by the one or more processors, an order of the electric vehicles on the list based upon a SOC remaining in each of the electric vehicles.

Additional Considerations

While the preferred embodiments of the invention have been described, it should be understood that the invention is not so limited and modifications may be made without departing from the invention. The scope of the invention is defined by the appended claims, and all devices that come within the meaning of the claims, either literally or by equivalence, are intended to be embraced therein.

It is therefore intended that the foregoing detailed description be regarded as illustrative rather than limiting, and that it be understood that it is the following claims, including all equivalents, that are intended to define the spirit and scope of this invention.

Although the text herein sets forth a detailed description of numerous different embodiments, it should be understood that the legal scope of the invention is defined by the words of the claims set forth at the end of this patent. The detailed description is to be construed as exemplary only and does not describe every possible embodiment, as describing every possible embodiment would be impractical, if not impossible. One could implement numerous alternate embodiments, using either current technology or technology developed after the filing date of this patent, which would still fall within the scope of the claims.

It should also be understood that, unless a term is expressly defined in this patent using the sentence "As used herein, the term '_' is hereby defined to mean . . . " or a similar sentence, there is no intent to limit the meaning of that term, either expressly or by implication, beyond its plain or ordinary meaning, and such term should not be interpreted to be limited in scope based upon any statement made in any section of this patent (other than the language of the claims). To the extent that any term recited in the claims at the end of this disclosure is referred to in this disclosure in a manner consistent with a single meaning, that is done for sake of clarity only so as to not confuse the reader, and it is not intended that such claim term be limited, by implication or otherwise, to that single meaning. Finally, unless a claim element is defined by reciting the word "means" and a function without the recital of any structure, it is not intended that the scope of any claim element be interpreted based upon the application of 35 U.S.C. § 112(f).

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component.

Similarly, structures and functionality presented as a single component may be implemented as separate components. These and other variations, modifications, additions, and improvements fall within the scope of the subject matter herein.

Additionally, certain embodiments are described herein as including logic or a number of routines, subroutines, applications, or instructions. These may constitute either software (code embodied on a non-transitory, tangible machine-readable medium) or hardware. In hardware, the routines, etc., are tangible units capable of performing certain operations and may be configured or arranged in a certain manner. In example embodiments, one or more computer systems (e.g., a standalone, client or server computer system) or one or more hardware modules of a computer system (e.g., a processor or a group of processors) may be configured by software (e.g., an application or application portion) as a hardware module that operates to perform certain operations as described herein.

In various embodiments, a hardware module may be implemented mechanically or electronically. For example, a hardware module may comprise dedicated circuitry or logic that is permanently configured (e.g., as a special-purpose processor, such as a field programmable gate array (FPGA) or an application-specific integrated circuit (ASIC)) to perform certain operations.

A hardware module may also comprise programmable logic or circuitry (e.g., as encompassed within a general-purpose processor or other programmable processor) that is temporarily configured by software to perform certain operations. It will be appreciated that the decision to implement a hardware module mechanically, in dedicated and permanently configured circuitry, or in temporarily configured circuitry (e.g., configured by software) may be driven by cost and time considerations.

Accordingly, the term "hardware" should be understood to encompass a tangible entity, be that an entity that is physically constructed, permanently configured (e.g., hardwired), or temporarily configured (e.g., programmed) to operate in a certain manner or to perform certain operations described herein. Considering embodiments in which hardware is temporarily configured (e.g., programmed), the hardware need not be configured or instantiated at any one instance in time. Software may accordingly configure a processor, for example, to constitute a particular hardware module at one instance of time and to constitute a different hardware module at a different instance of time. Hardware elements can provide information to, and receive information from, other hardware elements. Accordingly, the described hardware may be regarded as being communicatively coupled.

The various operations of example methods described herein may be performed, at least partially, by one or more processors that are temporarily configured (e.g., by software) or permanently configured to perform the relevant operations. Whether temporarily or permanently configured, such processors may constitute processor-implemented modules that operate to perform one or more operations or functions. The modules referred to herein may, in some example embodiments, comprise processor-implemented modules. Similarly, the methods or routines described herein may be at least partially processor-implemented. The performance of certain of the operations may be distributed among the one or more processors, not only residing within a single machine, but deployed across a number of machines. In some example embodiments, the processor or processors may be located in a single location (e.g., within a home environment, an office environment or as a server farm), while in other embodiments the processors may be distributed across a number of locations.

Unless specifically stated otherwise, discussions herein using words such as "processing," "computing," "calculating," "determining," "presenting," "displaying," or the like may refer to actions or processes of a machine (e.g., a computer) that manipulates or transforms data represented as physical (e.g., electronic, magnetic, or optical) quantities within one or more memories (e.g., volatile memory, non-volatile memory, or a combination thereof), registers, or other machine components that receive, store, transmit, or display information. As used herein any reference to "one embodiment" or "an embodiment" means that a particular element, feature, structure, or characteristic described in connection with the embodiment may be included in at least one embodiment. The appearances of the phrase "in one embodiment" in various places in the specification are not necessarily all referring to the same embodiment. Some embodiments may be described using the expression "coupled" and "connected" along with their derivatives. For example, some embodiments may be described using the term "coupled" to indicate that two or more elements are in direct physical or electrical contact. The term "coupled," however, may also mean that two or more elements are not in direct contact with each other, but yet still cooperate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. In addition, use of the "a" or "an" are employed to describe elements and components of the embodiments herein. This is done merely for convenience and to give a general sense of the description. In this description, and the claims that follow, the singular also includes the plural unless it is obvious that it is meant otherwise. This detailed description is to be construed as exemplary only and does not describe every possible embodiment, as describing every possible embodiment would be impractical, if not impossible. One could implement numerous alternate embodiments, using either current technology or technology developed after the filing date of this application.

Upon reading this disclosure, those of skill in the art will appreciate still additional alternative structural and functional designs for system and a method for assigning mobile device data to a vehicle through the disclosed principles herein. Thus, while particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein without departing from the spirit and scope defined in the appended claims.

The particular features, structures, or characteristics of any specific embodiment may be combined in any suitable manner and in any suitable combination with one or more other embodiments, including the use of selected features without corresponding use of other features. In addition, many modifications may be made to adapt a particular application, situation or material to the essential scope and spirit of the present invention. It is to be understood that other variations and modifications of the embodiments of the present invention described and illustrated herein are possible in light of the teachings herein and are to be considered part of the spirit and scope of the present invention.

What is claimed is:

1. A computer system configured to manage charging of electric vehicles, the computer system comprising at least one processor configured to:

determine a plurality of residential locations that include electric vehicle charging capabilities;

determine charging availability data of the plurality of residential locations, wherein the charging availability data of a first residential location of the plurality of residential locations includes occupancy data indicating when a person associated with the first residential location will be occupying the first residential location;

schedule charging of an electric vehicle at the first residential location at a time based at least in part upon the occupancy data for the first residential location indicating that the person will be occupying the first residential location at the time; and cause a notification associated with the scheduled charging of the electric vehicle at the first residential location to be transmitted to an electronic device associated with an operator of the electric vehicle.

2. The computer system of claim 1, wherein the first residential location comprises at least one of an apartment complex, a condominium complex, or a house.

3. The computer system of claim 1, wherein the electronic device comprises at least one of the electric vehicle or a computing device associated with the operator of the electric vehicle.

4. The computer system of claim 1, wherein the at least one processor is further configured to:

determine telematics data associated with the electric vehicle; and schedule the charging of the electric vehicle further based at least in part upon the telematics data.

5. The computer system of claim 4, wherein the telematics data comprises at least one of acceleration data, braking data, cornering data, speed data, direction data, route data, global positioning system (GPS) data, or state of charge (SOC) data.

6. The computer system of claim 5, wherein the at least one processor is further configured to:

determine that the electric vehicle has a SOC remaining to travel from a current location of the electric vehicle to the first residential location; and schedule the charging of the electric vehicle further based at least in part upon the determination that the electric vehicle has the SOC remaining to travel from the current location of the electric vehicle to the first residential location.

7. The computer system of claim 5, wherein the at least one processor is further configured to receive at least part of the telematics data from at least one of the electric vehicle or a computing device associated with the operator of the electric vehicle.

8. The computer system of claim 1, wherein the at least one processor is further configured to schedule the charging of the electric vehicle further based at least in part upon at least one of charging equipment at the first residential location, a neighborhood associated with the first residential location, one or more reviews associated with charging electric vehicles at the first residential location, frequency of electric vehicle charging at the first residential location, or accessibility of the first residential location.

9. The computer system of claim 8, wherein the at least one processor is further configured to determine the accessibility of the first residential location based at least in part upon a route of the electric vehicle and a location of the first residential location.

10. At least one non-transitory computer-readable storage medium with instructions stored thereon for managing charging of electric vehicles, wherein the instructions, when executed by at least one processor, cause the at least one processor to:

determine a plurality of residential locations that include electric vehicle charging capabilities;

determine charging availability data of the plurality of residential locations, wherein the charging availability data of a first residential location of the plurality of residential locations includes occupancy data indicating when a person associated with the first residential location will be occupying the first residential location;

schedule charging of an electric vehicle at the first residential location at a time based at least in part upon the occupancy data for the first residential location indicating that the person will be occupying the first residential location at the time; and cause a notification associated with the scheduled charging of the electric vehicle at the first residential location to be transmitted to an electronic device associated with an operator of the electric vehicle.

11. The at least one non-transitory computer-readable storage medium of claim 10, wherein the first residential location comprises at least one of an apartment complex, a condominium complex, or a house.

12. The at least one non-transitory computer-readable storage medium of claim 11, wherein the electronic device comprises at least one of the electric vehicle or a computing device associated with the operator of the electric vehicle.

13. The at least one non-transitory computer-readable storage medium of claim 10, wherein the instructions further cause the at least one processor to:

determine telematics data associated with the electric vehicle; and schedule the charging of the electric vehicle further based at least in part upon the telematics data.

14. The at least one non-transitory computer-readable storage medium of claim 13, wherein the telematics data comprises at least one of acceleration data, braking data, cornering data, speed data, direction data, route data, global positioning system (GPS) data, or state of charge (SOC) data.

15. The at least one non-transitory computer-readable storage medium of claim 14, wherein the instructions further cause the at least one processor to:

determine that the electric vehicle has a SOC remaining to travel from a current location of the electric vehicle to the first residential location; and schedule the charging of the electric vehicle further based at least in part upon the determination that the electric vehicle has the SOC remaining to travel from the current location of the electric vehicle to the first residential location.

16. The at least one non-transitory computer-readable storage medium of claim 10, wherein the instructions further cause the at least one processor to receive at least part of the telematics data from at least one of the electric vehicle or a computing device associated with the operator of the electric vehicle.

17. The at least one non-transitory computer-readable storage medium of claim 10, wherein the instructions further cause the at least one processor to schedule the charging of the electric vehicle further based at least in part upon at least one of charging equipment at the first residential location, a neighborhood associated with the first residential location, one or more reviews associated with charging electric vehicles at the first residential location, frequency of electric vehicle charging at the first residential location, or accessibility of the first residential location.

18. The at least one non-transitory computer-readable storage medium of claim 17, wherein the instructions further cause the at least one processor to determine the accessibility of the first residential location based at least in part upon a route of the electric vehicle and a location of the first residential location.

19. A computer-implemented method for managing charging of electric vehicles, the computer-implemented method implemented by at least one processor in communication with at least one memory, the computer-implemented method comprising:

determining a plurality of residential locations that include electric vehicle charging capabilities;

determining charging availability data of the plurality of residential locations, wherein the charging availability data of a first residential location of the plurality of residential locations includes occupancy data indicating when a person associated with the first residential location will be occupying the first residential location;

scheduling charging of an electric vehicle at the first residential location at a time based at least in part upon the occupancy data for the first residential location indicating that the person will be occupying the first residential location at the time; and causing a notification associated with the scheduled charging of the electric vehicle at the first residential location to be transmitted to an electronic device associated with an operator of the electric vehicle.

20. The computer-implemented method of claim 19, further comprising:

determining telematics data associated with the electric vehicle; and scheduling the charging of the electric vehicle further based at least in part upon the telematics data, wherein the telematics data comprises at least one of acceleration data, braking data, cornering data, speed data, direction data, route data, global positioning system (GPS) data, or state of charge (SOC) data.

* * * * *